United States Patent [19]
Hirabayashi et al.

[11] Patent Number: 5,575,885
[45] Date of Patent: Nov. 19, 1996

[54] COPPER-BASED METAL POLISHING SOLUTION AND METHOD FOR MANUFACTURING SEMICONDUCTOR DEVICE

[75] Inventors: Hideaki Hirabayashi, Tokyo; Masatoshi Higuchi, Kawasaki, both of Japan

[73] Assignee: Kabushiki Kaisha Toshiba, Kawasaki, Japan

[21] Appl. No.: 352,611

[22] Filed: Dec. 9, 1994

[30] Foreign Application Priority Data

Dec. 14, 1993 [JP] Japan ................................ 5-313406

[51] Int. Cl.⁶ .............................. H01L 21/00; C23F 1/00; B44C 1/22
[52] U.S. Cl. ........................... 156/626.1; 156/636.1; 156/656.1; 156/637.1; 252/79.4; 437/228; 216/38

[58] Field of Search ...................... 156/626.1, 636.1, 156/656.1, 637.1; 252/79.2, 79.4; 437/225, 228 PL; 216/84, 105, 38

[56] References Cited

U.S. PATENT DOCUMENTS

| | | |
|---|---|---|
| 4,954,142 | 9/1990 | Carr et al. . |
| 4,956,313 | 9/1990 | Cote et al. . |
| 5,225,034 | 7/1993 | Yu et al. .................... 156/636.1 |

Primary Examiner—William Powell
Attorney, Agent, or Firm—Oblon, Spivak, McClelland, Maier & Neustadt, P.C.

[57] ABSTRACT

Disclosed is a copper-based metal polishing solution which hardly dissolves a Cu film or a Cu alloy film when the film is dipped into the solution, and has a dissolution velocity during polishing several times higher than that during dipping. This copper-based metal polishing solution contains at least one organic acid selected from aminoacetic acid and amidosulfuric acid, an oxidizer, and water.

66 Claims, 14 Drawing Sheets

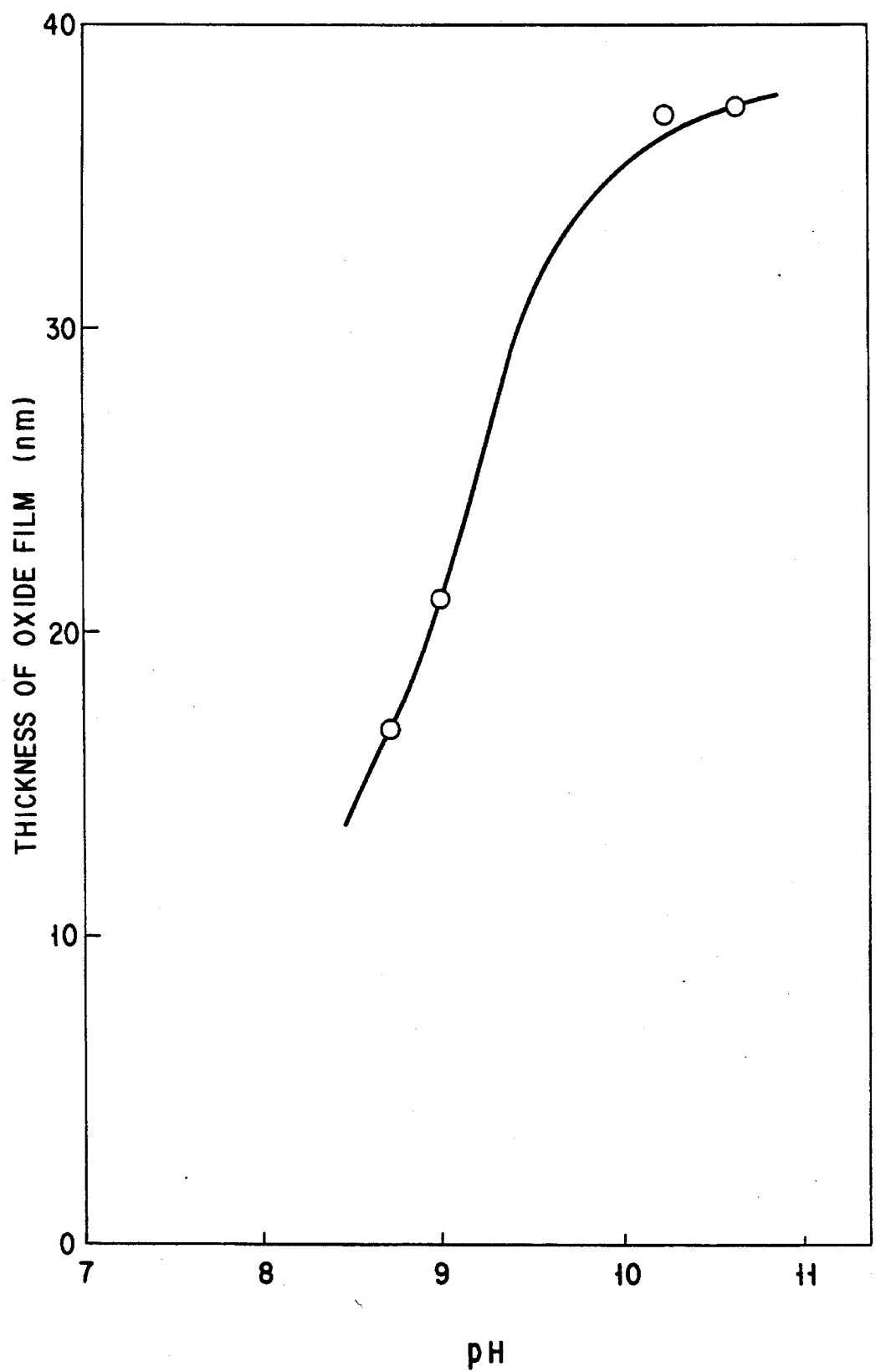
F I G. 7

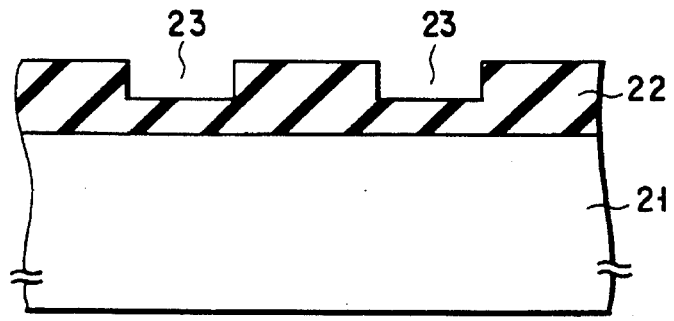
F I G. 8A
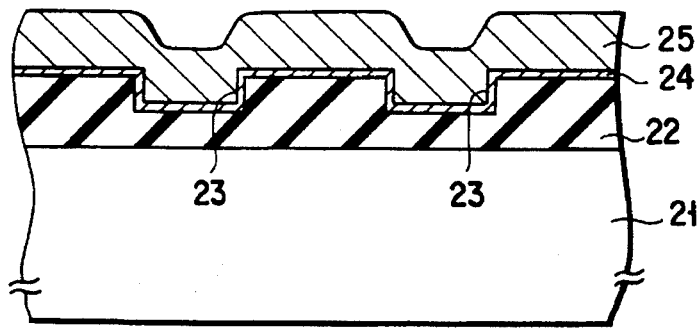
F I G. 8B
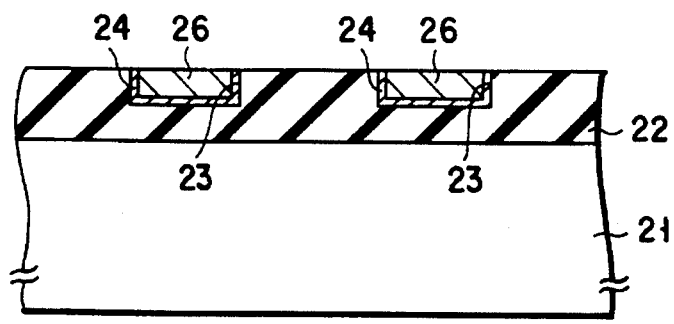
F I G. 8C

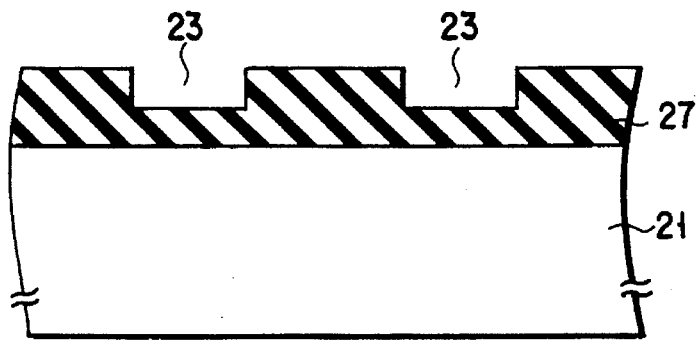
F I G. 14A
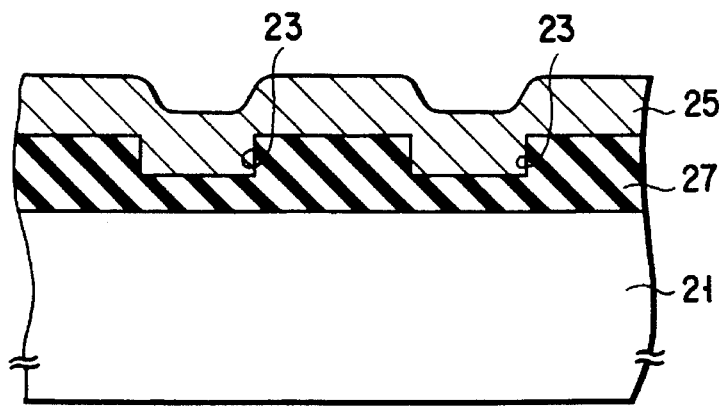
F I G. 14B
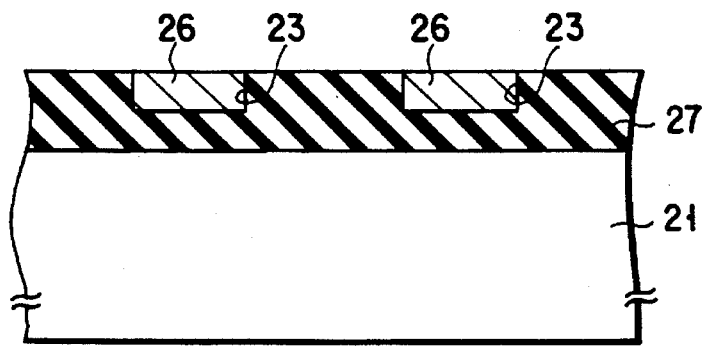
F I G. 14C

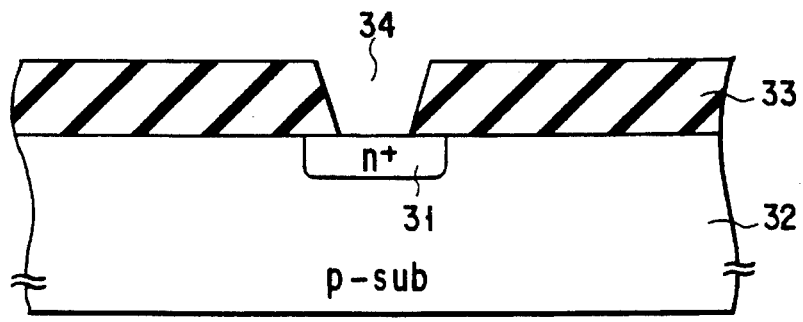
F I G. 15A
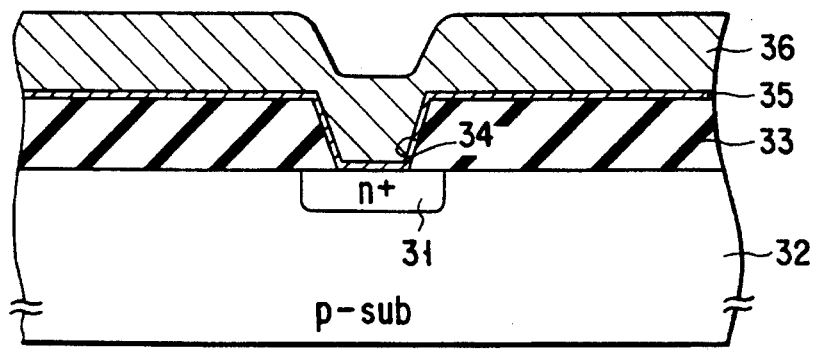
F I G. 15B
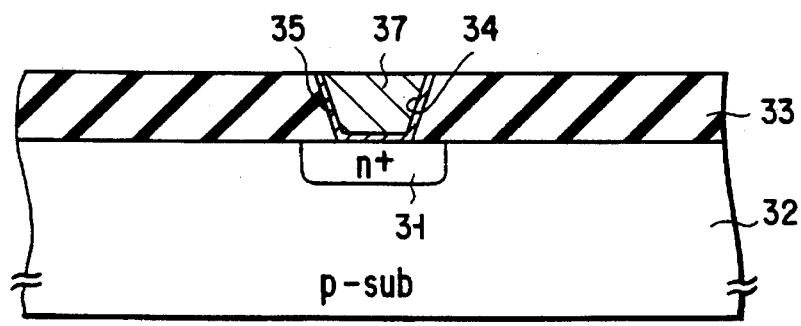
F I G. 15C

COPPER-BASED METAL POLISHING SOLUTION AND METHOD FOR MANUFACTURING SEMICONDUCTOR DEVICE

BACKGROUND OF THE INVENTION

1. Field of the Invention

The present invention relates to a copper-based metal polishing solution and a method for manufacturing a semiconductor device.

2. Description of the Related Art

A polishing solution for a Cu film or a Cu-alloy film, which consists of a slurry of amine-based colloidal silica or a slurry added with $K_3Fe(CN)_6$, $K_4(CN)_6$, or $Co(NO_3)_2$, is disclosed in J. Electrochem. Soc., Vol. 138, No. 11, 3460 (1991), VMIC Conference, ISMIC-101/92/0156 (1992) or VMIC Conference, ISMIC-102/93/0205 (1993).

Unfortunately, the above polishing solution has the following problem since there is no difference between the Cu film dissolution velocity of the polishing solution during dipping and that during polishing.

In the formation of an interconnecting layer as one manufacturing step of semiconductor devices, an etch-back technique is employed in order to remove steps from the device surface. This etch-back technique is a method in which a trench is formed in an insulating film on a semiconductor substrate, and a Cu film is deposited on the insulating film including the trench and polished by using a polishing solution, thereby forming a buried interconnecting layer by leaving the Cu film behind only in the trench. After this etch-back step, the Cu interconnecting layer remaining in the trench is brought into contact with a polishing solution. Therefore, if a polishing solution of the composition discussed above by which no difference is obtained between the Cu film etching rate during dipping and that during polishing, the Cu interconnecting layer is further etched by the polishing solution. As a result, the surface of the Cu interconnecting layer becomes lower than the surface of the insulating film. This makes it difficult to form an interconnecting layer whose surface is level with the surface of the insulating film, resulting in a low flatness. In addition, the resistance of a buried Cu interconnecting layer formed in this manner becomes higher than that of a Cu interconnecting layer which is so buried that its surface is level with the surface of an insulating film.

SUMMARY OF THE INVENTION

It is an object of the present invention to provide a copper-based metal polishing solution which hardly etches copper (Cu) or a copper alloy (Cu alloy) when this Cu or Cu alloy is dipped into the solution, and dissolves the Cu or Cu alloy during polishing with an etching rate several times to several ten times higher than that during the dipping.

It is another object of the present invention to provide a method for manufacturing a semiconductor device, in which a trench and/or an opening is formed in an insulating film on a semiconductor substrate, and an interconnection material film deposited on the insulating film and consisting of copper (Cu) or a copper alloy (Cu alloy) can be etched back within a short time period and at the same time a buried interconnecting layer whose surface is level with the surface of the insulating film can be formed.

It is still another object of the present invention to provide a method for manufacturing a semiconductor device, in which a trench and/or an opening is formed in an insulating film on a semiconductor substrate, an interconnection material film deposited on the insulating film and consisting of Cu or a Cu alloy can be etched back within a short time period to form a buried interconnecting layer whose surface is level with the surface of the insulating film, and the surface of the insulating film and the like after the etch back can be cleaned well.

According to the present invention, there is provided a copper-based metal polishing solution containing at least one organic acid selected from the group consisting of aminoacetic acid and amidosulfuric acid, an oxidizer, and water.

According to the present invention, there is also provided a method for manufacturing a semiconductor device, comprising the steps of:

forming at least one member selected from the group consisting of a trench and an opening corresponding to a shape of an interconnecting layer in an insulating film on a semiconductor substrate;

depositing an interconnection material film consisting of copper (Cu) or a copper alloy (Cu alloy) on the insulating film including at least one member selected from the group consisting of a trench and an opening; and polishing the interconnection material film until a surface of the insulating film is exposed by using a polishing solution containing at least one organic acid selected from the group consisting of aminoacetic acid and amidosulfuric acid, an oxidizer, and water, thereby forming a buried interconnecting layer in the insulating film such that surfaces of the interconnecting layer and the insulating film are level with each other.

Furthermore, according to the present invention, there is provided a method for manufacturing a semiconductor device, comprising the steps of:

forming at least one member selected from the group consisting of a trench and an opening corresponding to a shape of an interconnecting layer in an insulating film on a semiconductor substrate;

depositing an interconnection material film consisting of copper (Cu) or a copper alloy (Cu alloy) on the insulating film including at least one member selected from the group consisting of a trench and an opening;

polishing the interconnection material film until a surface of the insulating film is exposed by using a polishing solution containing at least one organic acid selected from the group consisting of aminoacetic acid and amidosulfuric acid, an oxidizer, and water, thereby forming a buried interconnecting layer in the insulating film such that surfaces of the interconnecting layer and the insulating film are level with each other; and treating the surface of the insulating film including the interconnecting layer with an aqueous dissolved ozone solution and then with an aqueous dilute hydrofluoric acid solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a graph showing a change in the thickness of an oxide layer formed on the surface of a Cu film as a function of the pH of the polishing solution of the present invention;

FIGS. 8A to 8C are sectional views showing manufacturing steps of the semiconductor device in Example 1 of the present invention;

FIGS. 14A to 14C are sectional views showing manufacturing steps of the semiconductor device in Example 3 of the present invention; and FIGS. 15A to 15F are sectional views showing manufacturing steps of the semiconductor device in Example 4 of the present invention.

DETAILED DESCRIPTION OF THE PREFERRED EMBODIMENTS

Figure 1:
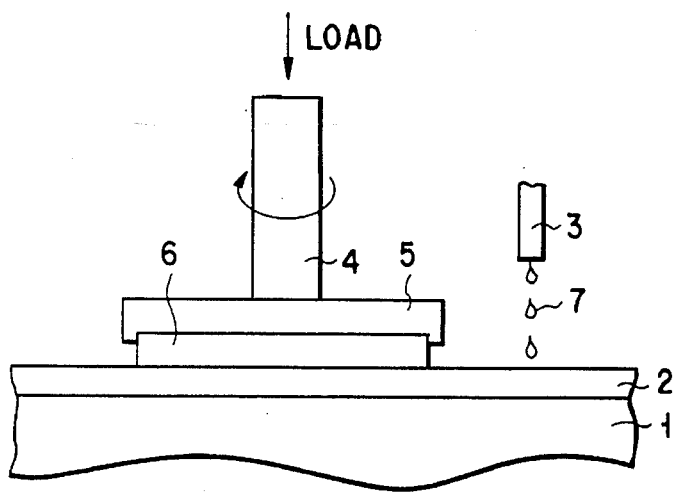
FIG. 1 is a schematic view showing a polishing apparatus for use in the process of polishing of the present invention.

A copper-based metal polishing solution according to the present invention contains at least one organic acid selected from aminoacetic acid and amidosulfuric acid, an oxidizer, and water. When Cu or a Cu alloy is dipped in this polishing solution, the polishing solution forms an oxide layer, which functions as an etching barrier, on the surface of the Cu or Cu alloy by the oxidizing action of the oxidizer. During polishing of the Cu or Cu alloy, the organic acid in the solution etches the Cu or Cu alloy which is exposed by mechanically removing the oxide layer. Therefore, etching of the Cu or Cu alloy is suppressed or prevented by the oxide layer while it is dipped into the polishing solution. During the polishing, the exposed Cu or Cu alloy is physically polished and etched by the organic acid contained in the polishing solution. This sufficiently increases the difference between the etching rate of the Cu or Cu alloy during the dipping and that during the polishing.

As the oxidizer, it is possible to use, e.g., hydrogen peroxide ($H_2O_2$) or soda hypochlorite (NaClO).

In the polishing solution, it is preferable that 0.01 to 10 wt % of the organic acid be contained and the weight ratio of the organic acid to the oxidizer be 1 to 20 or more. The content of the organic acid and the content ratio of the organic acid to the oxidizer in the polishing solution are thus defined for the reasons explained below.

If the content of the organic acid is smaller than 0.01 wt %, the polishing rate (primarily the chemical dissolution velocity) of Cu or a Cu alloy during polishing may decrease. On the other hand, if the content of the organic acid is larger than 10 wt %, etching of Cu or a Cu alloy may proceed exceedingly when the Cu or Cu alloy is dipped into the polishing solution to thereby nullify the difference between the etching rate during the dipping and that during polishing. The content of the organic acid is more preferably 0.01 to 1 wt %.

If the weight ratio of the organic acid to the oxidizer is 1 to less than 20, it may become impossible to obtain a sufficient etching rate difference between dipping of Cu or a Cu alloy and polishing of it. The content ratio of the organic acid to the oxidizer in the polishing solution is preferably 1 to 40 or more, and more preferably 1 to 100 or more.

It is desirable that the upper-limiting ratio of the oxidizer to the organic acid be defined by the content of the oxidizer. For example, the content of the oxidizer is preferably 30 wt %. If the content of the oxidizer exceeds 30 wt %, an oxide layer may immediately form on the exposed surface during polishing of Cu or a Cu alloy to result in a low polishing rate.

If the content of the organic acid is to be set at the lower-limiting value (0.01 wt %) within the range defined above, it is preferable that the content ratio of the organic acid to the oxidizer be set at 1 to 40 or more as a weight ratio.

The polishing solution according to the present invention may contain an alkaline agent for adjusting the pH of the solution between 9 and 14, in addition to the organic acid and the oxidizer. Suitable examples of this alkaline agent are potassium hydroxide and quinoline.

The polishing solution according to the present invention may contain abrasive grains, such as silica grains, alumina grains, cerium oxide grains, or zirconia grains, in addition to the organic acid and the oxidizer. These abrasive grains can be used in the form of a mixture of two or more types of grains.

The abrasive grains preferably have a mean grain size of 0.02 to 0.1 μm.

The abrasive grains are preferably added in an amount of 1 to 14 wt %. If the addition amount of the abrasive grains is less than 1 wt %, the effect of the grains becomes difficult to achieve. If, on the other hand, the addition amount of the abrasive grains is more than 14 wt %, the viscosity of the polishing solution is increased to make the solution difficult to handle. The addition amount of the abrasive grains is more preferably 3 to 10 wt %.

A polishing apparatus shown in FIG. 1 is used to polish a Cu film or a Cu alloy film formed on, e.g., a substrate by using the copper-based metal polishing solution according to the present invention. That is, a polishing pad 2 made of, e.g., cloth is covered on a turntable 1. A supply pipe 3 for supplying a polishing solution is arranged above the polishing pad 2. A substrate holder 5 having a support shaft 4 on its upper surface is arranged above the polishing pad 2 so as to be vertically movable and rotatable. In the polishing apparatus with this arrangement, the holder 5 holds a substrate 6 such that the surface (e.g., a Cu film) to be polished faces the pad 2. While a polishing solution 7 of the composition discussed above is supplied from the supply pipe 3, and a desired load is applied from the support shaft 4 to the substrate 6 toward the polishing pad 2. The Cu film on the substrate is polished while the turntable 1 and the holder 5 are rotated in the opposite direction.

The copper-based metal polishing solution according to the present invention as described above contains at least one organic acid selected from aminoacetic acid and amidosulfuric acid, an oxidizer, and water. Therefore, this polishing solution hardly etches Cu or Cu alloy when Cu or a Cu alloy is dipped into the solution (the etching rate is preferably 100 nm/min or less), and has an etching rate during polishing several times to several ten times higher than that during the dipping.

More specifically, an organic acid (e.g., aminoacetic acid) as one component of the polishing solution has a property of producing a complex by reacting with a hydrate of Cu, as indicated by the following reaction formula.

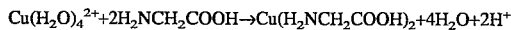

$$Cu(H_2O)_4^{2+} + 2H_2NCH_2COOH \rightarrow Cu(H_2NCH_2COOH)_2 + 4H_2O + 2H^+$$

Cu does not react with a solution mixture of aminoacetic acid and water. In this reaction system, the addition of an oxidizer (e.g., hydrogen peroxide) allows the reaction to proceed in the direction indicated by the arrow in the above formula, thereby etching Cu.

Figure 2:
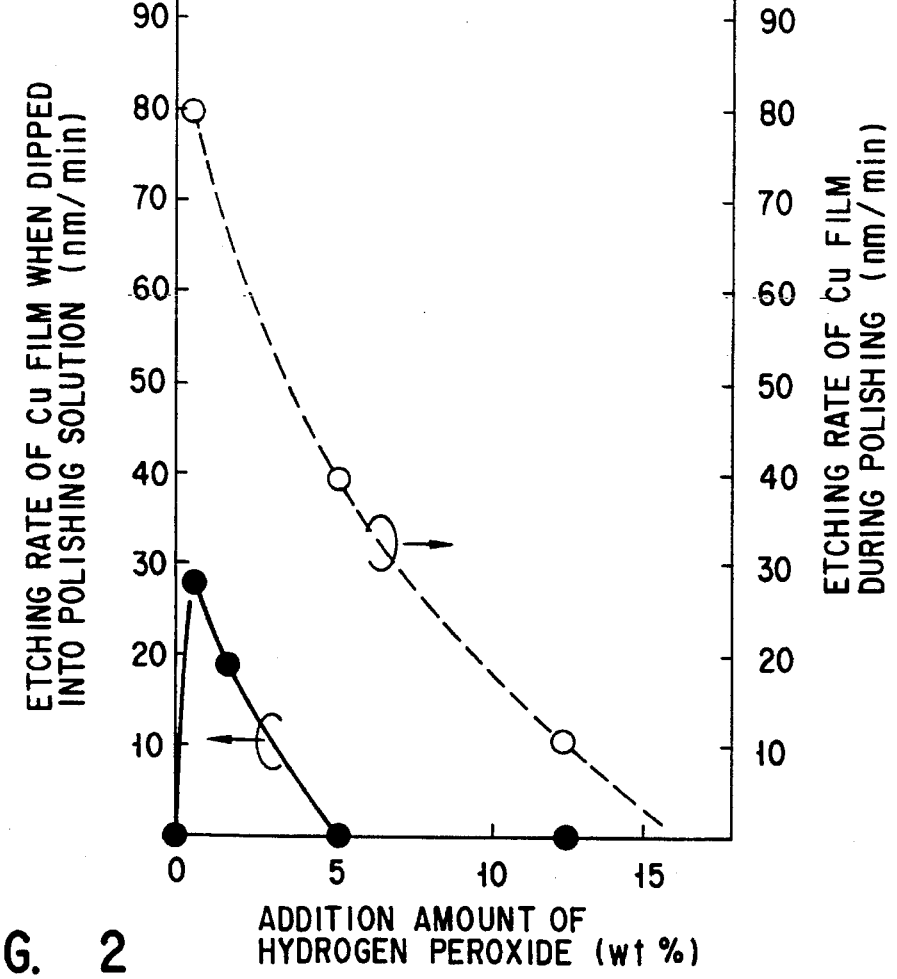
FIG. 2 is a graph showing the characteristics of a polishing solution composed of 0.1 wt % aminoacetic acid, hydrogen peroxide, and water, i.e., showing the relationship between the amount of hydrogen peroxide, the etching rate of a Cu film when the film was dipped into the solution, and the polishing rate of the Cu film during polishing.

FIG. 2 shows plots of the etching rate of a Cu film formed on a substrate during dipping and the etching rate of the film during polishing in a polishing solution composed of aminoacetic acid, hydrogen peroxide, and water, when the content of aminoacetic acid was kept constant at 0.1 wt % and the content of hydrogen peroxide was varied. Note that the polishing was done by using the polishing apparatus illustrated in FIG. 1. That is, a substrate on which a Cu film was formed was held upside down by the substrate holder 5 so that the Cu film faced the polishing pad 2 consisting of SUBA800 (tradename) manufactured by Rodel Nitta Corp. A load of 400 g/cm² was applied from the support shaft 4 to the substrate toward the polishing pad 2. While the turntable 1 and the holder 5 were rotated in the opposite directions at a rotating speed of 100 rpm, the polishing solution was supplied from the supply pipe 3 to the polishing pad 2 at a rate of 12.5 ml/min to perform polishing.

As is apparent from FIG. 2, the Cu film was not etched at all when dipped into a polishing solution added with no hydrogen peroxide. When the polishing solution contained a small amount of hydrogen peroxide, however, the Cu film was briskly etched. This is so because a hydrate of Cu was produced by hydrogen peroxide contained in the polishing solution and aminoacetic acid reacted with this Cu hydrate to produce a complex, thereby etching Cu. It is also evident from FIG. 2 that the Cu film etching rate was lowered as the content of hydrogen peroxide was increased further, and became zero when the content of hydrogen peroxide reached 5 wt %. The reason for this is assumed that an oxide layer which prevents etching by the polishing solution is formed on the surface of a Cu film if the content of hydrogen peroxide is increased.

Figure 3A:
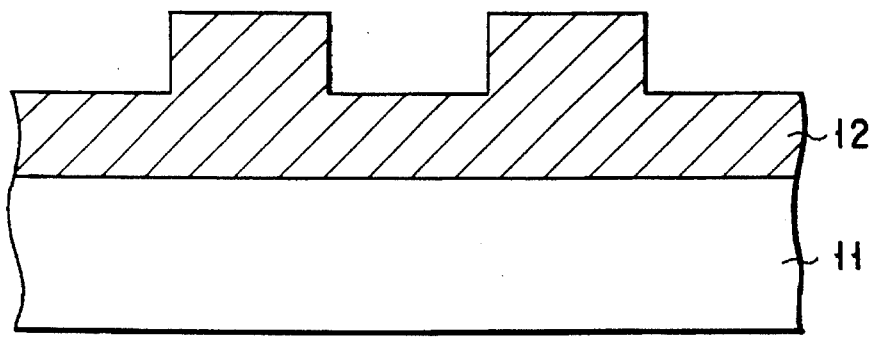
FIGS. 3A to 3C are sectional views showing the states of a Cu film with projections when the film was dipped into a polishing solution composed of aminoacetic acid, hydrogen peroxide, and water, and was polished by using a polishing apparatus.
Figure 3B:
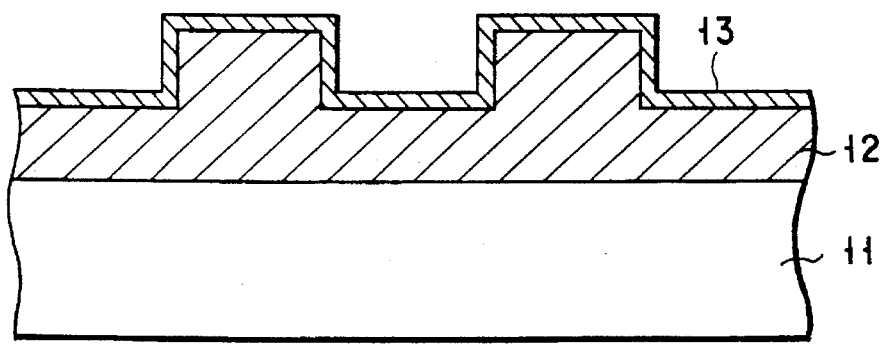
Figure 4:
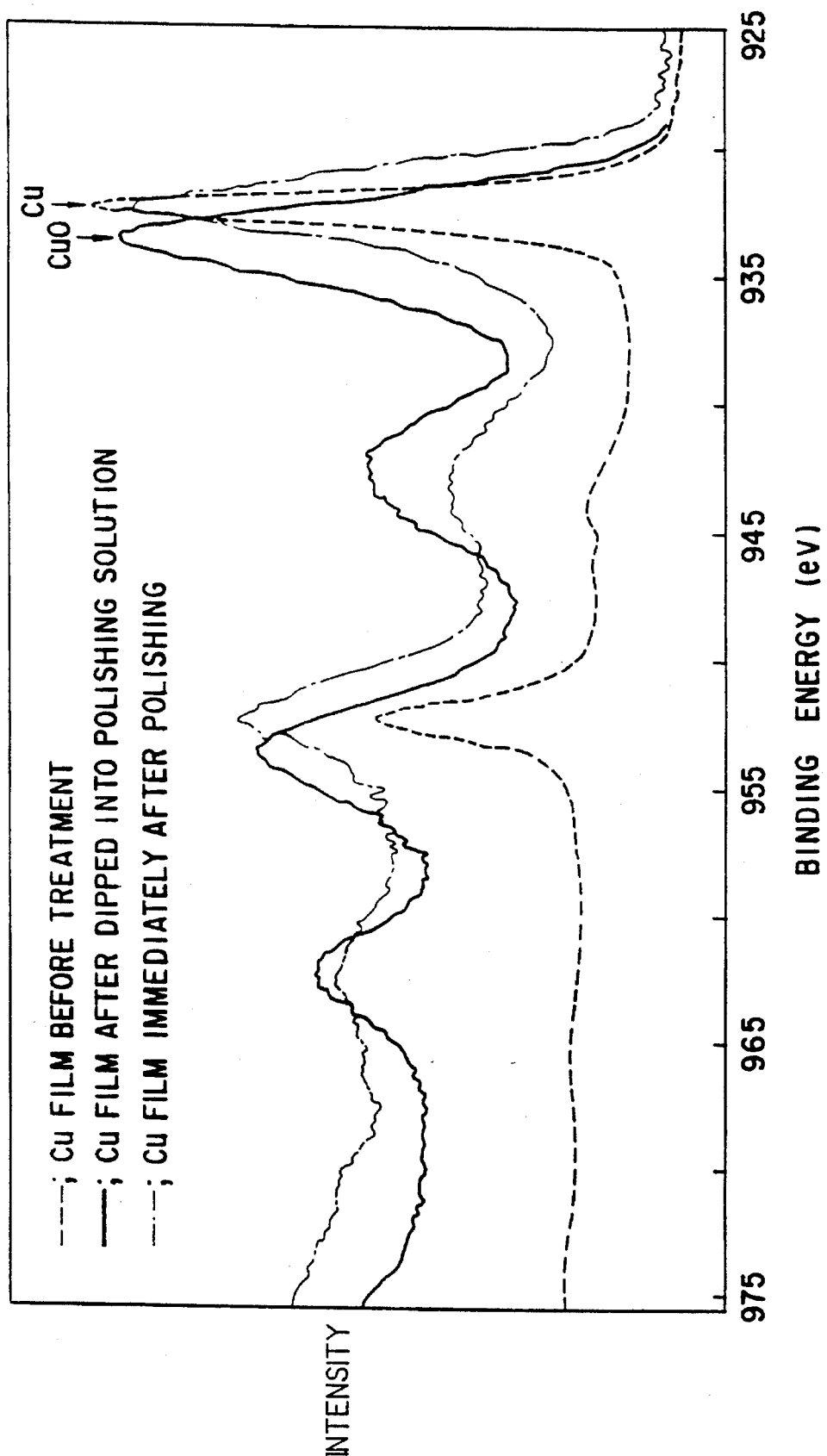
FIG. 4 is a graph showing the spectra of the surface of a Cu film obtained by XPS (X-ray Photoelectron Spectroscopy) before the treatment, after the film was dipped into the polishing solution of the present invention, and after the film was polished.

In effect, a Cu film 12 having projections was formed on a substrate 11, as shown in FIG. 3A, and the resultant substrate 11 was dipped into a polishing solution (containing 0.1 wt % of aminoacetic acid and 13 wt % of hydrogen peroxide) of the composition, FIG. 2, by which the etching rate was lowered. Consequently, as depicted in FIG. 3B, an oxide layer 13 was formed on the surface of the Cu film 12. In addition, the surface of the Cu film was analyzed with XPS after the substrate was dipped into the polishing solution. The result was that a spectrum indicated by the solid line in FIG. 4 appeared. This also demonstrates the formation of an oxide layer. Note that the dotted line in FIG. 4 represents the spectrum immediately after the Cu film was formed on the substrate and before the treatment.

Figure 3C:
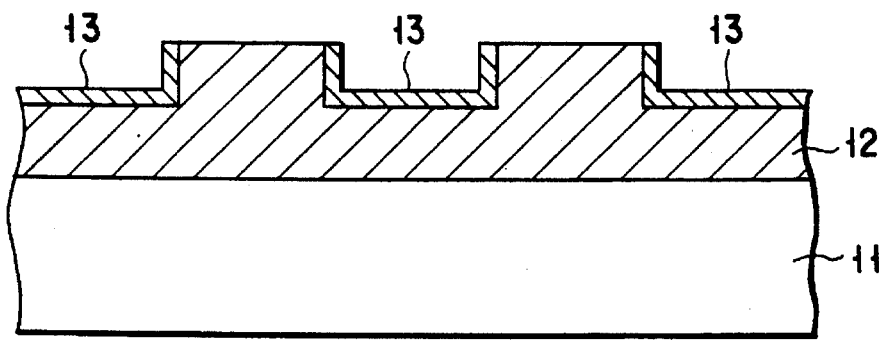

It was found that the polishing rate of a Cu film when polishing was done by using the polishing apparatus in FIG. 1 and the polishing solution containing 0.1 wt % of aminoacetic acid and 13 wt % of hydrogen peroxide was approximately 10 nm/min, which was sufficiently higher than the Cu film etching rate during the dipping, as shown in FIG. 2. This rise in the Cu film polishing rate resulting from the polishing was due to the reason explained below. That is, when the Cu film 12 on the surface of which the oxide layer 13 was formed, FIG. 3B, was polished with a polishing pad soaked with the above polishing solution, the oxide layer 13 on each projecting portion of the Cu film 12 was mechanically polished by the pad to expose pure Cu to the surface as illustrated in FIG. 3C. As a consequence, active chemical polishing was brought about by the action of aminoacetic acid and hydrogen peroxide contained in the polishing solution. That is, in the polishing step pure Cu is constantly exposed to the surface to be polished of a Cu film, and this permits chemical etching by aminoacetic acid and hydrogen peroxide contained in the polishing solution. In effect, when the surface of a Cu film immediately after polishing was analyzed by XPS, a spectrum indicated by the alternate long and short dashed line in FIG. 4 appeared, demonstrating the exposure of Cu.

Figure 5:
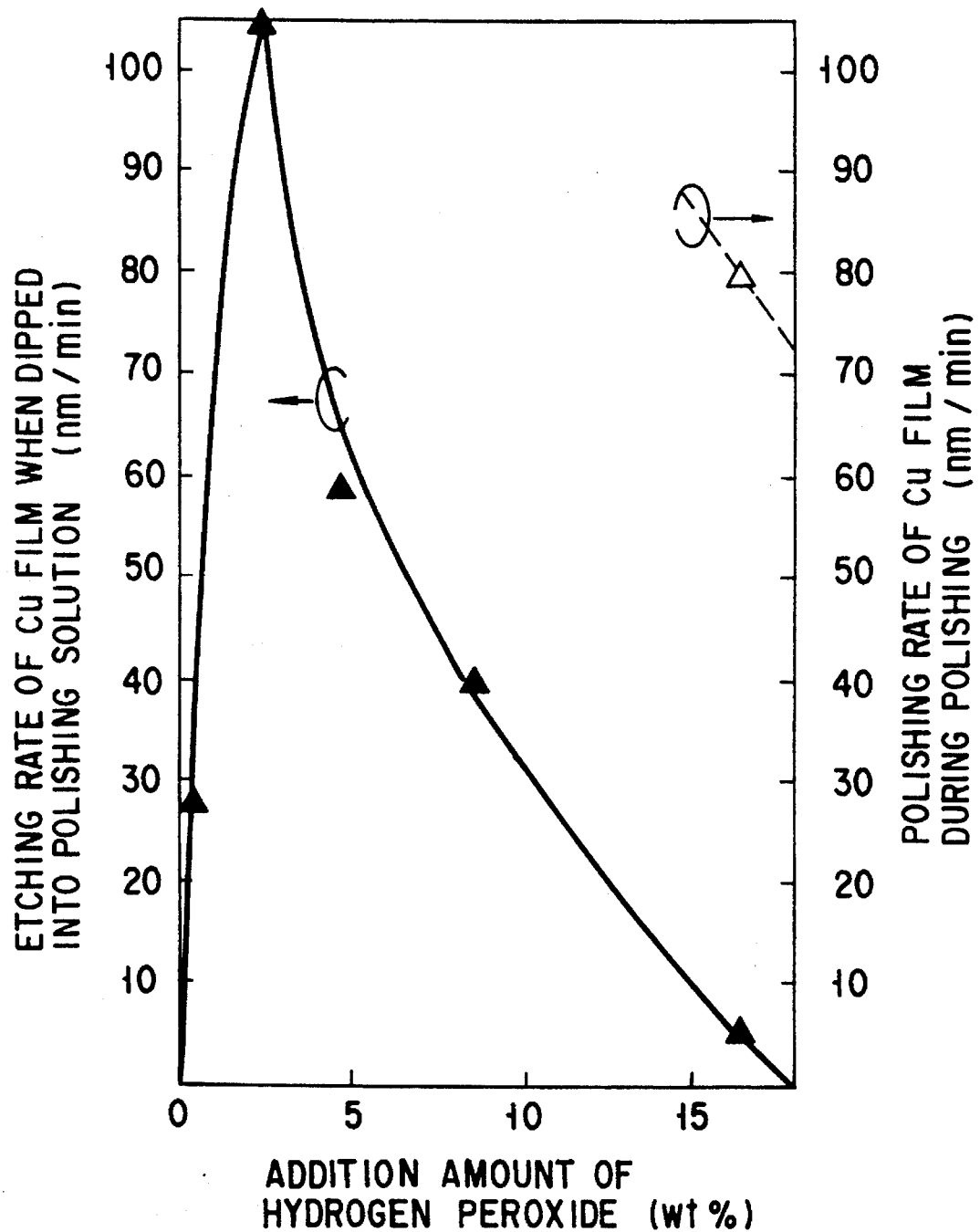
FIG. 5 is a graph showing the characteristics of a polishing solution composed of 0.9 wt % aminoacetic acid, hydrogen peroxide, and water, i.e., showing the relationship between the amount of hydrogen peroxide, the etching rate of a Cu film when the film was dipped into the solution, and the polishing rate of the Cu film during polishing.

FIG. 5 shows plots of the etching rate of a Cu film formed on a substrate during dipping and the polishing rate of the film during polishing in a polishing solution composed of aminoacetic acid, hydrogen peroxide, and water, when the content of aminoacetic acid was held constant at 0.9 wt % and the content of hydrogen peroxide was varied. Note that the polishing was done following the same procedures as discussed above by using the polishing apparatus shown in FIG. 1. As can be seen from FIG. 5, the Cu film was not etched at all when dipped into a polishing solution added with no hydrogen peroxide. However, the Cu film was vigorously etched when a small amount of hydrogen peroxide was added to the polishing solution. FIG. 5 also reveals that the Cu film etching rate decreased as the content of hydrogen peroxide was increased further, and became zero when the content of hydrogen peroxide reached about 18 wt %. The reason for this is considered that an oxide layer which prevents etching by the polishing solution is formed on the surface of a Cu film if the content of hydrogen peroxide is increased. A Cu film was polished following the same procedures as described above by using a polishing solution containing 15 wt % of hydrogen peroxide. As a result, the Cu film was polished at a rate of approximately 85 nm/min, i.e., the etching rate during the polishing was sufficiently higher than that during the dipping. However, the polishing rate of a Cu film during polishing was about 60 nm/min even by the use of a polishing solution which contained 20 wt % of hydrogen peroxide and by which etching of a Cu film was reliably prevented during dipping, i.e., a polishing solution in which the content ratio of aminoacetic acid to hydrogen peroxide was 1 to about 20 as a weight ratio. Therefore, the etching rate during the polishing was sufficiently higher than that during the dipping.

Figure 6:
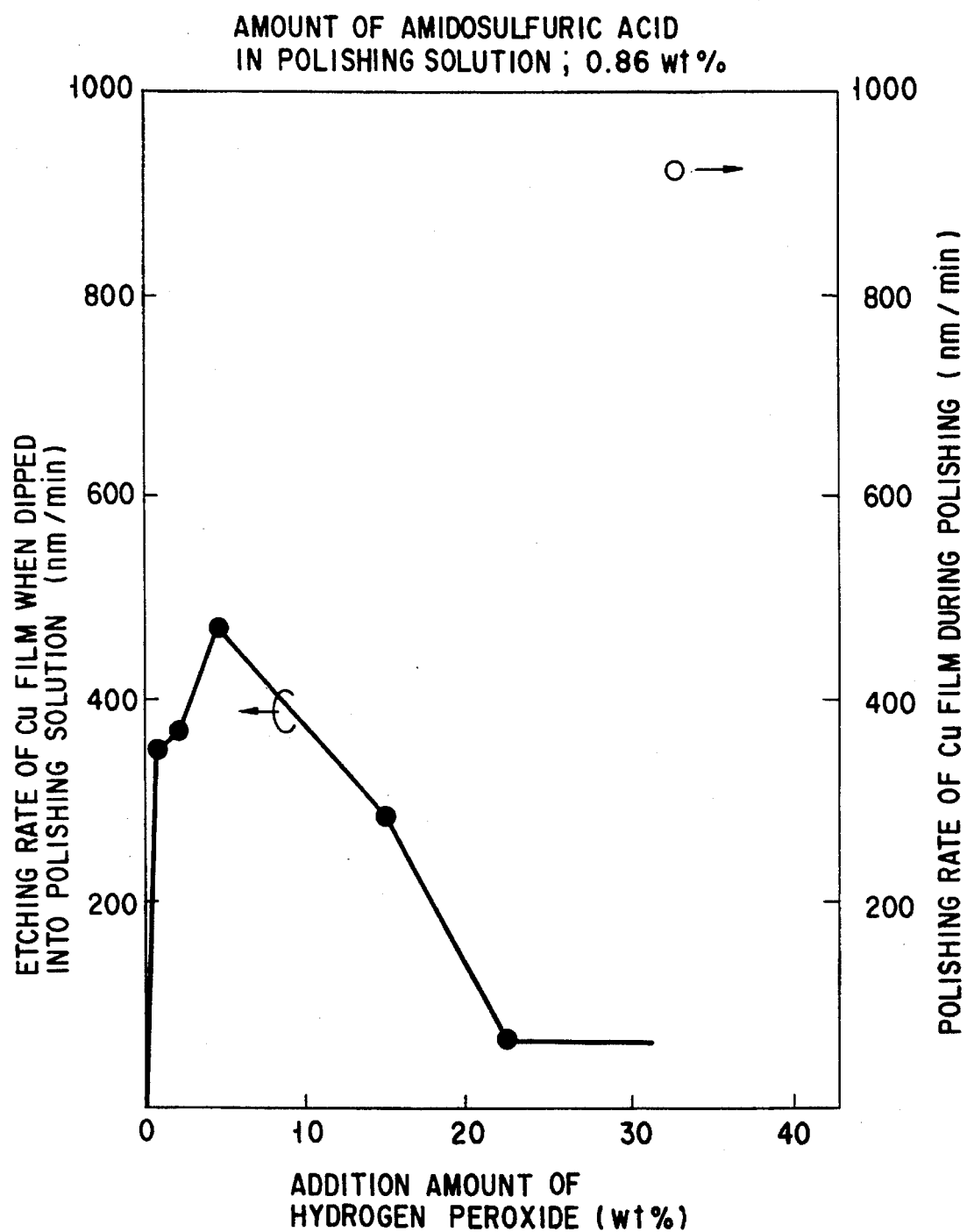
FIG. 6 is a graph showing the characteristics of a polishing solution composed of amidosulfuric acid, hydrogen peroxide, and water, i.e., showing the relationship between the amount of hydrogen peroxide, the etching rate of a Cu film when the film was dipped into the solution, and the polishing rate of the Cu film during polishing.

FIG. 6 shows plots of the etching rate of a Cu film formed on a substrate during dipping and the polishing rate of the film during polishing in a polishing solution composed of amidosulfuric acid as an organic acid, hydrogen peroxide, and water, when the content of amidosulfuric acid was held constant at 0.86 wt % and the content of hydrogen peroxide was varied. Note that the polishing was done following the same procedures as discussed above by using the polishing apparatus depicted in FIG. 1. It is evident from FIG. 6 that the Cu film was not etched at all when a polishing solution added with no hydrogen peroxide was used, but was actively etched when the polishing solution contained a small amount of hydrogen peroxide. It is also apparent from FIG. 6 that the Cu film etching rate was lowered as the content of hydrogen peroxide was increased, and was 50 nm/min when the content of hydrogen peroxide was about 22 wt % or more. The reason for this is assumed that an oxide layer which prevents etching by the polishing solution is formed on the surface of a Cu film if the content of hydrogen peroxide is increased. A Cu film was polished following the same procedures as described above by using a polishing solution which contained 30 wt % of hydrogen peroxide, i.e., in which the content ratio of amidosulfuric acid to hydrogen peroxide was 1 to about 35 as a weight ratio. Consequently, the Cu film was polished at a rate of approximately 950 nm/min. That is, the etching rate during the polishing was sufficiently high, about 19 times higher than that during the dipping.

As discussed above, the polishing solution according to the present invention hardly etches Cu or Cu alloy when Cu or a Cu alloy is dipped into the solution, and has an etching rate during polishing several times to several ten times higher than that during dipping. For this reason, it is possible to avoid the problem that, for example, the Cu etching amount varies depending on the supply timing of a polishing solution in the polishing step. This allows an easy polishing operation. In addition, an oxide layer is formed on a Cu film on a substrate by hydrogen peroxide, as mentioned earlier, when the Cu film comes into contact with the polishing solution after being polished by the polishing apparatus. This prevents so-called over-etching in which the Cu film continues to be etched after the polishing. Furthermore, as illustrated in FIG. 3C, in the polishing step the Cu film 12 having projections is sequentially etched from the surface of each projection in contact with the polishing pad while the side surfaces of the film remain unetched. Therefore, the polishing solution is very suitable for an etch-back technique (to be described later).

By adjusting the pH of the polishing solution according to the present invention between 9 and 14 by adding an alkaline agent such as potassium hydroxide to the solution, an oxide layer having a good etching barrier property with respect to the polishing solution can be formed on the surface of Cu or a Cu alloy when the Cu or Cu alloy is dipped into the solution. It is also possible to control the thickness of the oxide layer formed on the surface of Cu or a Cu alloy. FIG. 7 is a graph showing a change in the thickness of an oxide layer formed on the surface of a Cu film formed on a substrate when the Cu film was dipped into a polishing solution which contained 0.9 wt % of aminoacetic acid and 12 wt % of hydrogen peroxide and in which the pH was adjusted between 8.5 and 11 by addition of potassium hydroxide. As shown in FIG. 7, the thickness of the oxide layer formed on the surface of the Cu film increases as the pH rises.

The polishing solution whose pH is adjusted between 9 and 14 allows formation of an oxide layer having a good etching battier property on the surface of Cu or a Cu alloy when the Cu or Cu alloy is dipped into the polishing solution. Therefore, even if the content of an organic acid such as aminoacetic acid in the polishing solution is increased, Cu is hardly etched when Cu or a Cu alloy is dipped into the solution. During polishing, on the other hand, this increase in the content of the organic acid makes it possible to increase the etching rate of the Cu or Cu alloy. Consequently, the difference between the etching rate during the dipping and that during the polishing can be increased as compared with a polishing solution added with no alkaline agent. The result is a reduced polishing time of the Cu or Cu alloy.

By adding abrasive grains such as silica grains to the polishing solution according to the present invention, it is possible to improve the polishing rate during polishing of Cu or a Cu alloy compared to a polishing solution not added with the abrasive grains. As examples, polishing solutions were prepared by adding about 9 wt % of silica grains with a mean grain size of 30 nm, alumina grains with a mean grain size of 740 nm, cerium oxide grains with a mean grain size of 1300 nm, and zirconia grains with a mean grain size of 1100 nm to an aqueous solution containing 0.1 wt % of aminoacetic acid and 13 wt % of hydrogen peroxide. Each of the resultant polishing solutions was used to polish a Cu film formed on a substrate and having projections following the same procedures as discussed earlier by using the polishing apparatus illustrated in FIG. 1. A list of the Cu film polishing rates of these polishing solutions is given in Table 1 below. Note that Table 1 also shows the polishing rate of a Cu film polished with a polishing solution added with no abrasive grains and containing 0.1 wt % of aminoacetic acid and 13 wt % of hydrogen peroxide.

TABLE 1

| Type of abrasive grain | Polishing rate of Cu film (nm/min) |
|---|---|
| Silica grain | 35.3 |
| Alumina grain | 98.5 |
| Cerium oxide grain | 31.1 |
| Zirconia grain | 22.1 |
| None | 10.0 |

As can be seen from Table 1 above, the polishing rate of a Cu film can be improved by the use of each polishing solution added with abrasive grains compared to the polishing solution added with no abrasive grains. It is also evident from Table 1 that the Cu film polishing rate can be controlled by changing the type of abrasive grain.

An $SiO_2$ film, an $Si_3N_4$ film, and a borophosphosilicate glass film (BPSG film) formed on substrates were polished following the same procedures as discussed earlier by using polishing solutions added with silica grains and alumina grains as abrasive grains and the polishing apparatus illustrated in FIG. 1. Table 2 below shows the polishing rates of the individual insulating films obtained by these polishing solutions. Note that each value in parentheses in Table 2 indicates the velocity ratio calculated from (the polishing rate of a Cu film/the polishing rate of an insulating film in a polishing solution of the same type). In the manufacture of semiconductor devices to be described later, the selective polishing property for Cu can be improved as the velocity ratio is increased in forming a buried Cu interconnecting layer in a trench or the like of an insulating film by polishing. That is, a decrease in thickness of the underlying insulating film can be suppressed.

TABLE 2

| Type of abrasive grain | Polishing rate of insulating film (nm/min) | | |
| --- | --- | --- | --- |
| | $SiO_2$ film | $Si_3N_4$ film | BPSG film |
| Silica grain | 1 (35.3) | 0.4 (88.3) | 4.7 (7.5) |
| Alumina grain | 7.7 (12.8) | 3.5 (28.1) | 41.2 (2.39) |

Furthermore, the polishing solution added with abrasive grains such as silica grains can perform polishing well without producing cracks or fine flaws on a Cu film or a Cu alloy film. This is so because, when the polishing step is performed by using the polishing apparatus shown in FIG. 1, the frictional force between the surface to be polished of a Cu film and the polishing pad can be reduced by the abrasive grains. This consequently reduces the impact force on the Cu film, preventing cracks and the like.

The polishing solution added with abrasive grains such as silica grains, therefore, can improve the polishing rate of Cu or a Cu alloy in comparison with a polishing solution added with no abrasive grains, and can also suppress damages to the surface of Cu or a Cu alloy during the polishing.

Note that a polishing solution containing amidosulfuric acid as an organic acid and abrasive grains such as silica grains also can improve the polishing rate of Cu or a Cu alloy compared to a polishing solution added with no abrasive grains, and can suppress damages to the surface of Cu or a Cu alloy during the polishing.

A method for manufacturing a semiconductor device according to the present invention comprises the steps of:

forming a trench and/or an opening corresponding to a shape of an interconnecting layer in an insulating film on a semiconductor substrate;

depositing an interconnection material film consisting of copper (Cu) or a copper alloy (Cu alloy) on the insulating film including the trench and/or opening; and polishing the interconnection material film until a surface of the insulating film is exposed by using a polishing solution containing at least one organic acid selected from the group consisting of aminoacetic acid and amidosulfuric acid, an oxidizer, and water, thereby forming a buried interconnecting layer in the insulating film such that surfaces of the interconnecting layer and the insulating film are level with each other.

As the insulating film, it is possible to use, e.g., a silicon oxide film, a silicon nitride film, a two-layer film constituted by a silicon oxide film and a silicon nitride film stacked on the silicon oxide film, a borophosphosilicate glass film (BPSG film), or a phosphosilicate glass film (PSG film).

As the Cu alloy, it is possible to use, e.g., a Cu—Si alloy, a Cu—Al alloy, a Cu—Si—Al alloy, or a Cu—Ag alloy.

The interconnection material film consisting of Cu or a Cu alloy is deposited by sputter vapor deposition, vacuum vapor deposition, or the like.

It is preferable that the content of the organic acid and the content ratio of the organic acid to the oxidizer in the polishing solution fall within ranges identical with those of the copper-based metal polishing solution discussed above.

The polishing solution may contain an alkaline agent for adjusting the solution pH between 9 and 14, in addition to the organic acid and the oxidizer. Preferable examples of this alkaline agent are potassium hydroxide and quinoline.

The polishing solution may contain abrasive grains, such as silica grains, alumina grains, cerium oxide grains, or zirconia grains, in addition to the organic acid and the oxidizer. The mean grain size and the addition amount of these abrasive grains preferably fall within ranges identical with those of the copper-based metal polishing solution described above.

Polishing using the above polishing solution is performed by using the polishing apparatus explained earlier with reference to FIG. 1.

In the polishing using the polishing apparatus of FIG. 1, the load applied to a substrate held by the substrate holder toward the polishing pad is properly selected in accordance with the composition of a polishing solution. As an example, the load is preferably 200 to 2000 $g/cm^2$ for a polishing solution composed of an organic acid, an oxidizer, and water. The load is preferably 150 to 1000 $g/cm^2$ for a polishing solution further containing abrasive grains such as silica grains.

In the method for manufacturing a semiconductor device according to the present invention, a barrier layer may be formed on the insulating film formed on the semiconductor substrate and including the trench and/or opening prior to depositing the interconnection material film. With the formation of this barrier layer on the insulating film including the trench and/or opening, it is possible to form a buried interconnecting layer surrounded by the barrier layer by deposition and etch back of an interconnection material layer such as Cu. As a result, it is possible to prevent contamination of the semiconductor substrate caused by diffusion of Cu as the interconnection material layer.

The barrier layer consists of, e.g., TiN, Ti, Nb, W, or a CuTa alloy. The thickness of the barrier layer is preferably 15 to 50 nm.

In the method for manufacturing a semiconductor device according to the present invention, the end point of polishing may be detected on the basis of a change in the torque of the turntable of the polishing apparatus shown in FIG. 1, a change in the temperature of the polishing pad of the apparatus, or a change in the pH of the polishing solution supplied to the polishing pad. It is also possible to detect the end point of polishing on the basis of a change in the torque of the holder of the polishing apparatus in FIG. 1. The end point of the polishing can be detected easily with these methods. Therefore, a buried interconnecting layer can be reliably formed in the insulating film by using this end point detection.

In the method for manufacturing a semiconductor device according to the present invention as discussed above, a trench and/or an opening corresponding to an interconnecting layer is formed in an insulating film on a semiconductor substrate. An interconnection material film consisting of Cu or a Cu alloy is deposited on the insulating film including the trench and/or opening. The interconnection material film is polished until the surface of the insulating film is exposed by using a polishing solution containing at least one organic acid selected from aminoacetic acid and amidosulfuric acid, an oxidizer, and water, and the polishing apparatus shown in FIG. 1. As has been discussed earlier, the polishing solution hardly etches a Cu film or a Cu alloy film when the film is dipped into the solution, and has an etching rate during polishing which is several times to several ten times higher than that during dipping. Consequently, in the polishing step the interconnection material film is sequentially etched from its surface, i.e., subjected to so-called etch back. This makes it possible to form a buried interconnecting layer consisting of Cu or a Cu alloy in the trench and/or opening in the insulating film such that the surface of the interconnecting layer is level with the surface of the insulating film. The interconnecting layer after etched back is brought into contact with the polishing solution. Since, however, an oxide layer is formed on the exposed surface of the interconnecting layer, it is possible to avoid etching of the interconnecting layer by this oxide layer. Therefore, a semiconductor device having a highly precise buried interconnecting layer and a flat surface can be manufactured.

Also, by adjusting the pH of the polishing solution between 9 and 14 with an alkaline agent such as potassium hydroxide, etching of the interconnecting layer after the etch-back step can be prevented by an oxide film which is formed on the surface of the interconnecting layer and has a good etching barrier property, even if the amount of the organic acid, such as aminoacetic acid, contained in the polishing solution is increased. In addition, increasing the content of the organic acid in the polishing solution increases the polishing rate of the interconnection material film. As a result, the etch-back time can be shortened.

Furthermore, the use of a polishing solution added with abrasive grains such as silica grains makes it possible to raise the polishing rate of the interconnection material layer. This also reduces the etch-back time. It is also possible to discourage occurrence of cracks or flaws on the interconnection material film in the etch-back step. Consequently, a highly reliable buried interconnecting layer can be formed in the trench and/or opening of the insulating film.

Another method for manufacturing a semiconductor device according to the present invention comprises the steps of:

forming a trench and/or an opening corresponding to a shape of an interconnecting layer in an insulating film on a semiconductor substrate;

depositing an interconnection material film consisting of copper (Cu) or a copper alloy (Cu alloy) on the insulating film including the trench and/or opening;

polishing the interconnection material film until a surface of the insulating film is exposed by using a polishing solution containing at least one type of an organic acid selected from the group consisting of aminoacetic acid and amidosulfuric acid, an oxidizer, and water, thereby forming a buried interconnecting layer in the insulating film such that surfaces of the interconnecting layer and the insulating film are level with each other; and treating the surface of the insulating film including the interconnecting layer with an aqueous dissolved ozone solution and then with an aqueous dilute hydrofluoric acid solution.

As the insulating film, it is possible to use, e.g., a silicon oxide film, a silicon nitride film, a two-layer film constituted by a silicon oxide film and a silicon nitride film stacked on the silicon oxide film, a borophosphosilicate glass film (BPSG film), or a phosphosilicate glass film (PSG film).

As the Cu alloy, it is possible to use, e.g., a Cu—Si alloy, a Cu—Al alloy, a Cu—Si—Al alloy, or a Cu—Ag alloy.

The interconnection material film consisting of Cu or a Cu alloy is deposited by sputter vapor deposition, vacuum vapor deposition, or the like process.

It is preferable that the content of an organic acid and the content ratio of the organic acid to an oxidizer in the polishing solution fall within ranges identical with those of the copper-based metal polishing solution discussed above.

The polishing solution may contain an alkaline agent for adjusting the solution pH between 9 and 14, in addition to the organic acid and the oxidizer. Preferable examples of this alkaline agent are potassium hydroxide and quinoline.

The polishing solution may contain abrasive grains, such as silica grains, alumina grains, cerium oxide grains, or zirconia grains, in addition to the organic acid and the oxidizer. The mean grain size and the addition amount of these abrasive grains preferably fall within ranges identical with those of the copper-based metal polishing solution described above.

Polishing using the above polishing solution is performed by using the polishing apparatus explained earlier with reference to FIG. 1.

In the polishing using the polishing apparatus of FIG. 1, the load applied to a substrate held by the substrate holder toward the polishing pad is properly selected in accordance with the composition of a polishing solution. As an example, the load is preferably 200 to 2000 g/cm$^2$ for a polishing solution composed of an organic acid, an oxidizer, and water. The load is preferably 150 to 1000 g/cm$^2$ for a polishing solution further containing abrasive grains such as silica grains.

In this method for manufacturing of a semiconductor device according to the present invention, a barrier layer may be formed on the insulating film formed on the semiconductor substrate and including the trench and/or opening prior to depositing the interconnection material film. With the formation of this barrier layer on the insulating film including the trench and/or opening, it is possible to form a buried interconnecting layer surrounded by the barrier layer by deposition and etch back of an interconnection material layer such as Cu. As a result, it is possible to prevent contamination of the semiconductor substrate caused by diffusion of Cu as the interconnection material layer.

The barrier layer consists of, e.g., TiN, Ti, Nb, W, or a CuTa alloy. The thickness of the barrier layer is preferably 15 to 50 nm.

In this method for manufacturing a semiconductor device according to the present invention, the end point of polishing may be detected on the basis of a change in the torque of the turntable of the polishing apparatus shown in FIG. 1, a change in the temperature of the polishing pad of the apparatus, or a change in the pH of the polishing solution supplied to the polishing pad. It is also possible to detect the end point of polishing on the basis of a change in the torque of the holder of the polishing apparatus in FIG. 1. The end point of the polishing can be detected easily with these methods. Therefore, a buried interconnecting layer can be reliably formed in the insulating film by using this end point detection.

The ozone concentration of the aqueous dissolved ozone solution is preferably 0.1 to 25 ppm. If the ozone concentration of the aqueous dissolved ozone solution is smaller than 0.1 ppm, it becomes difficult to convert Cu or a Cu alloy, as the interconnection material remaining on the insulating film, into an oxide, or to oxidatively destroy a contaminant such as an organic substance. The ozone concentration of the aqueous dissolved ozone solution is more preferably 5 to 25 ppm.

The hydrofluoric acid concentration of the aqueous dilute hydrofluoric acid solution is preferably 0.05 to 20%. If the hydrofluoric acid concentration of the aqueous dilute hydrofluoric acid solution is less than 0.05%, it becomes difficult to effectively dissolve away the oxide of the Cu or Cu alloy which is converted by the treatment using the aqueous dissolved ozone solution. On the other hand, if the hydrofluoric acid concentration of the aqueous dilute hydrofluoric acid solution is more than 20%, when a silicon oxide film is used as an insulating film, this oxide film also may be removed by dissolution to cause a decrease in the film thickness. The hydrofluoric acid concentration of the aqueous dilute hydrofluoric acid solution is more preferably 0.1 to 5%.

In this method for manufacturing a semiconductor device according to the present invention as discussed above, a trench and/or an opening corresponding to an interconnecting layer is formed in an insulating film on a semiconductor substrate. An interconnection material film consisting of Cu or a Cu alloy is deposited on the insulating film including the trench and/or opening. The interconnection material film is polished until the surface of the insulating film is exposed by using a polishing solution containing at least one organic acid selected from aminoacetic acid and amidosulfuric acid, an oxidizer, and water, and the polishing apparatus shown in FIG. 1. As has been discussed earlier, the polishing solution hardly etches a Cu film or a Cu alloy film when the film is dipped into the solution, and has an etching rate during polishing which is several times to several ten times higher than that during dipping. Consequently, in the polishing step the interconnection material film is sequentially etched from its surface, i.e., subjected to so-called etch back. This makes it possible to form a buried interconnecting layer consisting of Cu or a Cu alloy in the trench and/or opening in the insulating film such that the surface of the interconnecting layer is level with the surface of the insulating film. The interconnecting layer after etched back is brought into contact with the polishing solution. Since, however, an oxide layer is formed on the exposed surface of the interconnecting layer, it is possible to avoid etching of the interconnecting layer by this oxide layer.

In addition, by treating the surface of the insulating film including the interconnecting layer with the aqueous dissolved ozone solution after the etch-back step, it is possible to convert a fine interconnection material, i.e., Cu or a Cu alloy, remaining on the insulating film into an oxide, or to oxidatively destroy a pollutant such as an organic substance. By performing a treatment with the aqueous dilute hydrofluoric acid solution after the treatment using the aqueous dissolved ozone solution, it is possible to readily dissolve away the oxide of the Cu or Cu alloy from the insulting film or the oxidatively destroyed product of the pollutant.

Consequently, it is possible to manufacture a semiconductor device having a highly precise buried interconnecting layer and a flat surface which is cleaned by removing an organic substance or the residual interconnection material from the surface of an insulating film.

Also, by adjusting the pH of the polishing solution between 9 and 14 with an alkaline agent such as potassium hydroxide, etching of the interconnecting layer after the etch-back step can be prevented by an oxide film which is formed on the surface of the interconnecting layer and has a good etching barrier property, even if the amount of the organic acid, such as aminoacetic acid, contained in the polishing solution is increased. In addition, increasing the content of the organic acid in the polishing solution increases the polishing rate of the interconnection material film. As a result, the etch-back time can be shortened.

Furthermore, the use of a polishing solution added with abrasive grains such as silica grains makes it possible to raise the polishing rate of the interconnection material layer. This also reduces the etch-back time. It is also possible to discourage occurrence of cracks or flaws on the interconnection material film in the etch-back step. Consequently, a highly reliable buried interconnecting layer can be formed in the trench and/or opening of the insulating film.

The present invention will be described in more detail below by way of its preferred examples.

EXAMPLE 1

First, as in FIG. 8A, a 1000 nm thick $SiO_2$ film 22 as an insulating interlayer was deposited by a CVD process on a silicon substrate 21 on the surface of which diffusion layers such as a source and a drain (not shown) were formed. Thereafter, a plurality of trenches 23, 500 nm in depth, having a shape corresponding to an interconnecting layer were formed in the $SiO_2$ film 22 by photoetching. As shown in FIG. 8B, a 15 nm thick TiN barrier layer 24 and a 600 nm thick Cu film 25 were deposited in this order by sputter vapor deposition on the $SiO_2$ film 22 including the trenches 23.

Subsequently, the substrate 21, FIG. 8B, was held upside down by the substrate holder 5 of the polishing apparatus discussed earlier with reference to FIG. 1. A load of 300 $g/cm^2$ was applied from the support shaft 4 of the holder 5 to the substrate toward the polishing pad 2 which was covered on the turntable 1 and consisted of SUBA800 (tradename) manufactured by Rodel Nitta Corp. While the turntable 1 and the holder 5 were rotated in the opposite directions at a rotating speed of 100 ppm, a polishing solution was supplied from the supply pipe 3 to the polishing pad 2 at a rate of 20 ml/min, thereby polishing the Cu film 25 and the barrier layer 24 deposited on the substrate 21 until the surface of the $SiO_2$ film 22 was exposed. Note that the polishing solution used was pure water containing 0.1 wt % of aminoacetic acid, 13.0 wt % of hydrogen peroxide, and 8 wt % of a silica powder with a mean grain size of 0.04 μm, in which the weight ratio of aminoacetic acid to hydrogen peroxide was 1 to 130. In the polishing step described above, the etching rate of the polishing solution when the solution was in contact with the Cu film was zero, and the etching rate during the polishing performed by the polishing pad was about 77 nm/min, which was sufficiently higher than that during the dipping. Consequently, in the polishing step the Cu film 25 with projections as in FIG. 8B was preferentially polished from the surface in mechanically contact with the polishing pad, and the exposed barrier layer 24 was then polished; i.e., so-called etch back was performed. As a result, as illustrated in FIG. 8C, the barrier layer 24 was left behind only in the trenches 23, and a buried Cu interconnecting layer 26 whose surface was level with the surface of the $SiO_2$ film 22 was formed in the trenches 23 covered with the barrier layer 24. After the load applied from the holder 5 of the polishing apparatus to the polishing pad 2 was removed and the rotations of the turntable 1 and the holder 5 were stopped, no etching proceeded even when the Cu interconnecting layer 26 came into contact with the polishing solution.

Figure 9:
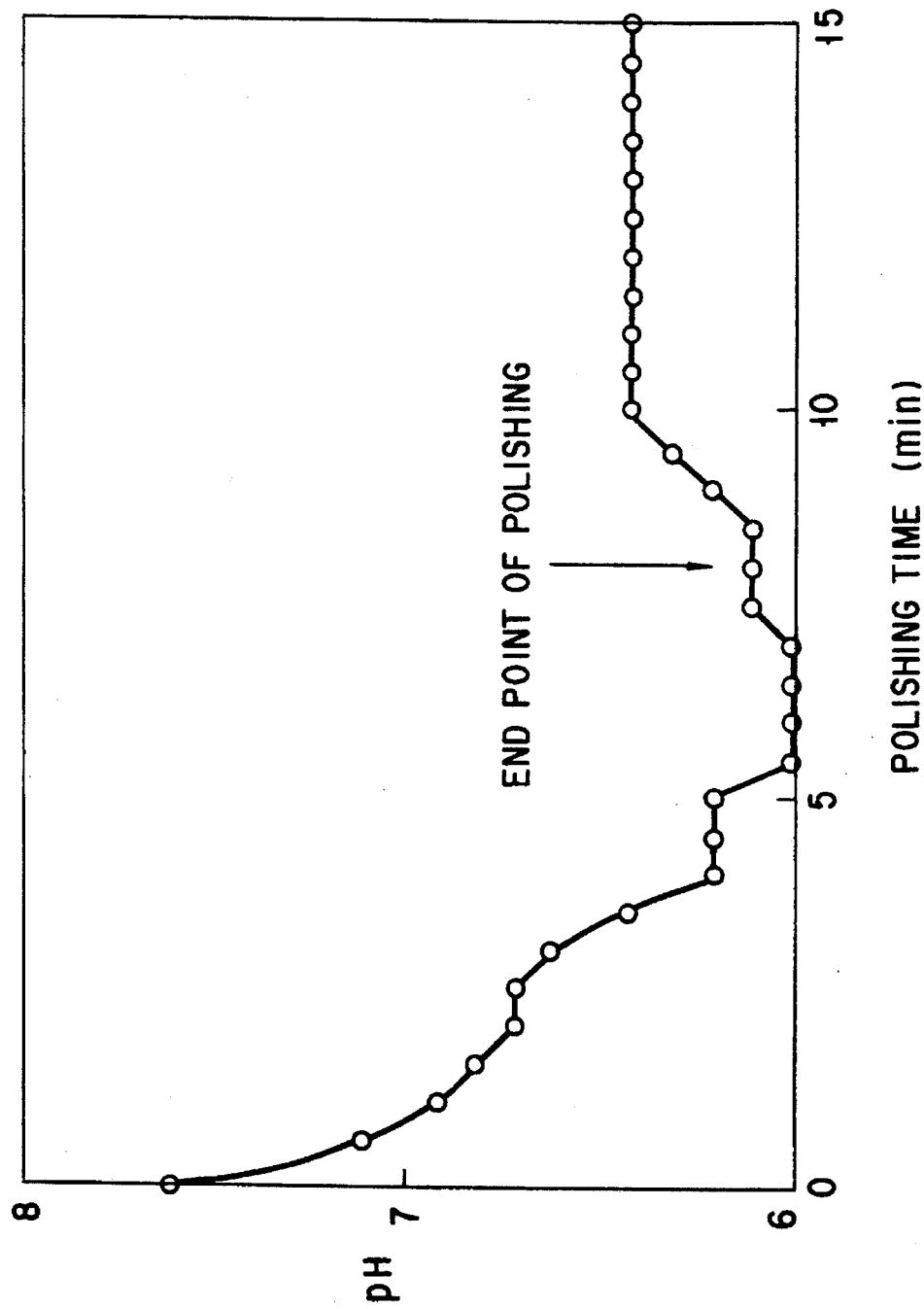
FIG. 9 is a graph showing a change in the pH of the polishing solution during polishing (an etch-back step) in Example 1.

In the polishing step (etch-back step) performed by the polishing apparatus shown in FIG. 1, the polishing solution was sampled at proper intervals from the polishing pad, and a change in the pH of the solution was measured with a pH meter. FIG. 9 shows the pH change of the polishing solution as a function of the polishing time. In FIG. 9, a point at which the pH which once had declined started to rise again is defined as the etching end point (e.g., 8 minutes after the loading from the holder to the substrate was started). By setting the etch-back time on the basis of this end point detection, it was possible to form a buried Cu interconnecting layer 26, the surface of which was level with the surface of the $SiO_2$ film 22, in the trenches 23 of the film 22 with a high reproducibility.

Figure 10:
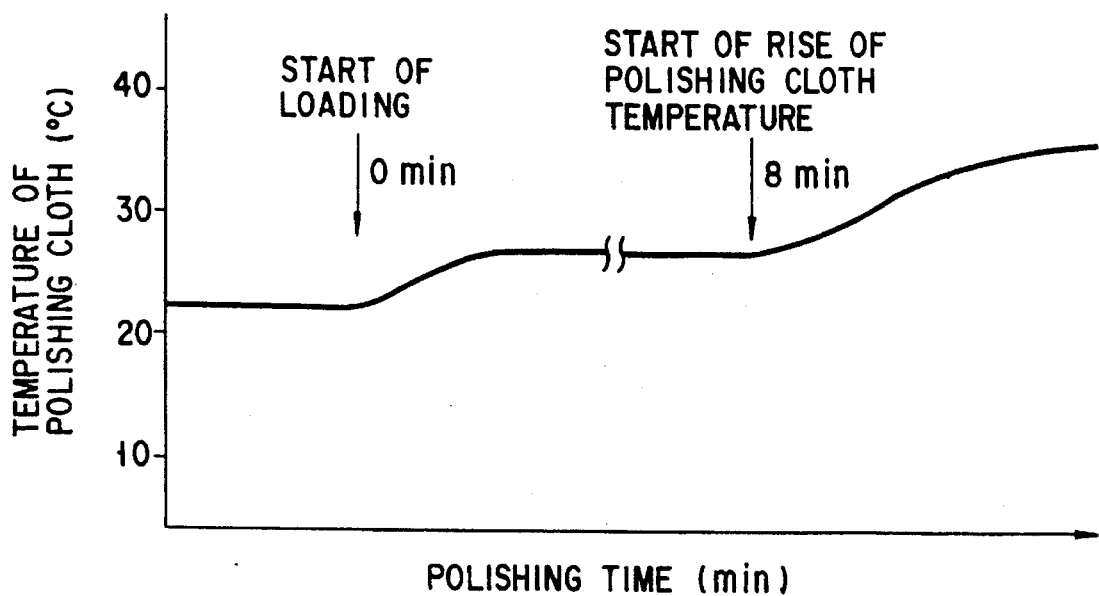
FIG. 10 is a graph showing a change in the temperature of a polishing cloth during the polishing (the etch-back step) in Example 1.
Figure 11:
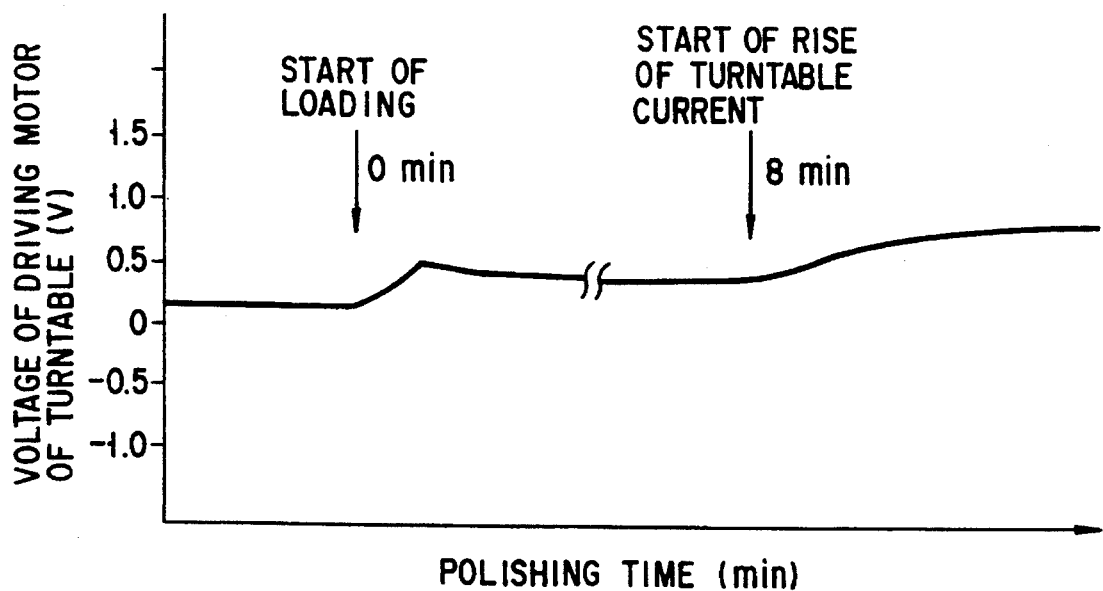
FIG. 11 is a graph showing a change in the voltage of a driving motor of a turntable during the polishing (the etch-back step) in Example 1.

In the polishing step (etch-back step) done by the polishing apparatus illustrated in FIG. 1, a change in the temperature of the polishing pad was measured by a temperature sensor, and a change in the voltage of a driving motor of the turntable was also measured. FIG. 10 shows the temperature change of the polishing pad as a function of the polishing time. FIG. 11 shows the voltage change of the driving motor as a function of the polishing time. In FIG. 10 illustrating the temperature change, a point at which the temperature of the polishing pad, which had risen to a constant temperature immediately after the start of loading, started to rise again is defined as the etching end point. In FIG. 11 showing the voltage change, a point at which the voltage of the driving motor of the turntable, which had risen to a fixed voltage immediately after the start of loading, started to rise again is defined as the etching end point. By setting the etch-back time on the basis of these end point detections, it was possible to form with a high reproducibility a buried Cu interconnecting layer 26, the surface of which was level with the surface of the $SiO_2$ film 22, in the trenches 23 of the film 22.

Figure 12:
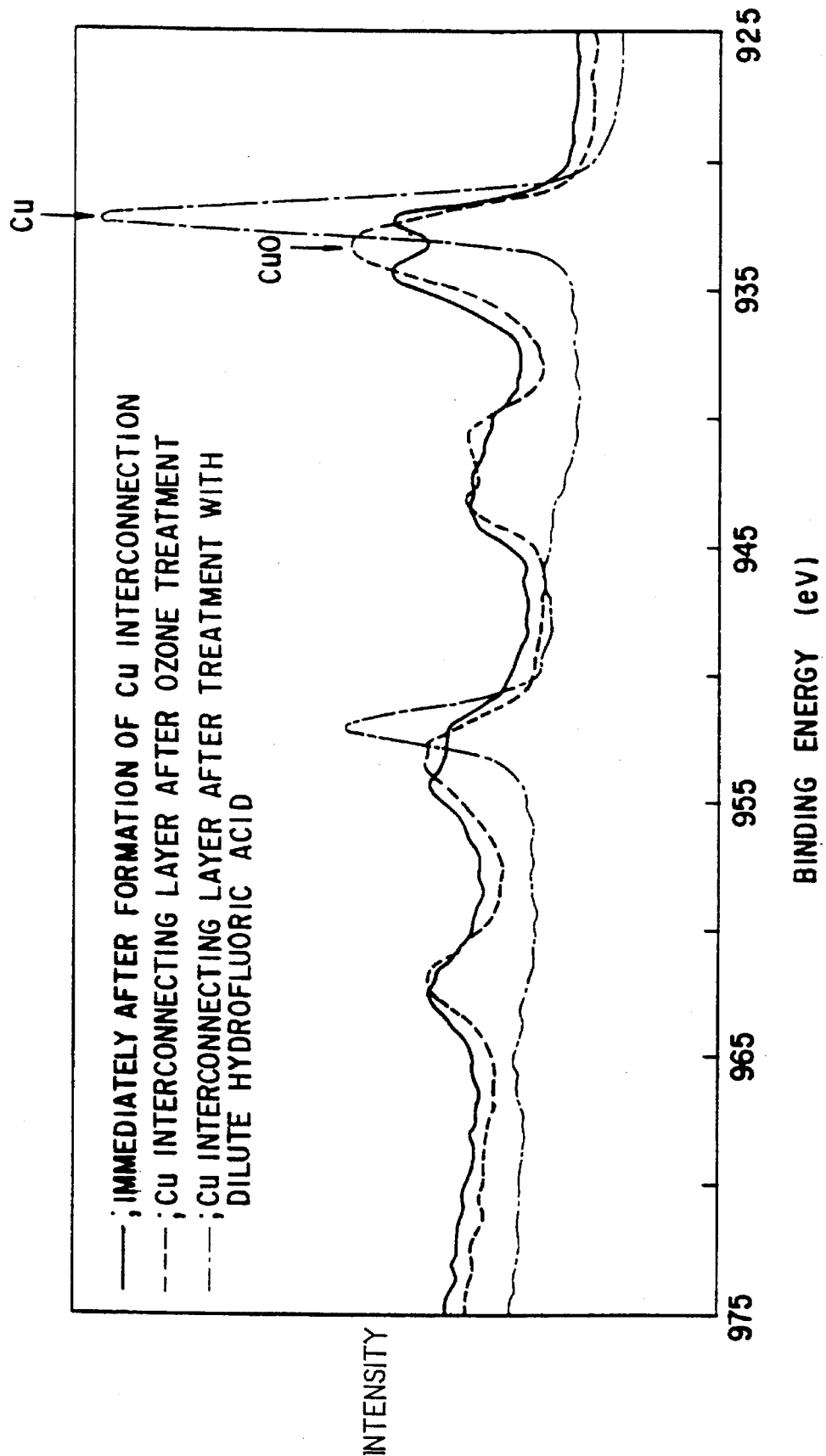
FIG. 12 is a graph showing the spectra of the surface of a Cu interconnecting layer obtained by XPS immediately after formation, after an ozone treatment, and after a treatment using dilute hydrofluoric acid in Example 1 of the present invention.

The substrate in which the buried interconnecting layer was formed was treated by dipping into an aqueous dissolved ozone solution with an ozone concentration of 0.001% for 3 minutes. The substrate was then treated by dipping into an aqueous dilute hydrofluoric acid solution with a hydrofluoric acid concentration of 10% for 90 seconds. FIG. 12 is a graph showing spectra analyzed by XPS. In FIG. 12, the solid line indicates a spectrum of the surface immediately after the formation of the Cu interconnecting layer; the dotted line, a spectrum of the surface of the Cu interconnecting layer after the treatment with the aqueous dissolved ozone solution; and the alternate long and short dashed line, a spectrum of the surface of the Cu interconnecting layer after the treatment with the aqueous dilute hydrofluoric acid solution. As is apparent from FIG. 12, when the substrate in which the interconnection was formed was treated by dipping into the aqueous dissolved ozone solution, a signal of metal Cu that was observed immediately after the formation of the interconnection was no longer found, as indicated by the dotted-line spectrum. This indicates that the surface of the Cu interconnecting layer changed into an oxide. When the substrate was further treated with the aqueous dilute hydrofluoric acid solution, a signal of CuO that was observed in the treatment with the aqueous dissolved ozone solution disappeared, as shown by the spectrum represented by the alternate long and short dashed line. This demonstrates that pure Cu was exposed to the surface of the Cu interconnecting layer. That is, the treatment using the aqueous dissolved ozone solution makes it possible to destroy an organic substance, such as aminoacetic acid, remaining on the surface of the $SiO_2$ film 22 or the like, and to convert the residual Cu on the $SiO_2$ film 22 into an oxide. The destroyed product of the organic substance and the Cu oxide formed by the treatment using the aqueous dissolved ozone solution can be removed by the subsequent treatment using the aqueous dilute hydrofluoric acid solution. It is also possible to remove the Cu oxide layer formed on the surface of the Cu interconnecting layer by contact with the polishing solution. Consequently, the surface of the $SiO_2$ film 22 can be cleaned, and pure Cu can be exposed to the surface of the Cu interconnecting layer 26.

In Example 1 of the present invention, therefore, a buried Cu interconnecting layer 26 having a thickness equal to the depth of the trenches 23 of the $SiO_2$ film 22 can be formed in the trenches 23 such that the surface of the Cu interconnecting layer 26 is level with the surface of the $SiO_2$ film 22. This makes it possible to flatten the surface of the substrate 21 after the formation of the interconnecting layer 26. Additionally, by performing the treatment using the aqueous dissolved ozone solution and the treatment using the aqueous dilute hydrofluoric acid solution after the formation of the Cu interconnecting layer 26, the surface of the $SiO_2$ film 22 is cleaned, and the oxide layer which is produced by oxidation by the polishing solution and serves as a resistive component is removed. Consequently, it is possible to manufacture a semiconductor device which has a buried Cu interconnecting layer with a low resistance characteristic of Cu and which is highly reliable.

Note that the same procedures as discussed above in Example 1 were also followed by using a polishing solution which was pure water containing 0.86 wt % of amidosulfuric acid, 30 wt % of hydrogen peroxide, and 8 wt % of a silica powder with a mean grain size of 0.09 μm. As a result, as in Example 1, it was possible to form a buried interconnecting layer in trenches of an $SiO_2$ insulating interlayer such that the surfaces of the interconnecting layer and the $SiO_2$ film were level with each other.

EXAMPLE 2

Figure 13A:
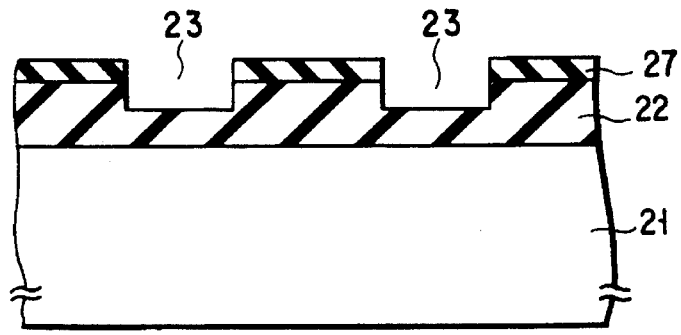
FIGS. 13A to 13C are sectional views showing manufacturing steps of the semiconductor device in Example 2 of the present invention.
Figure 13B:
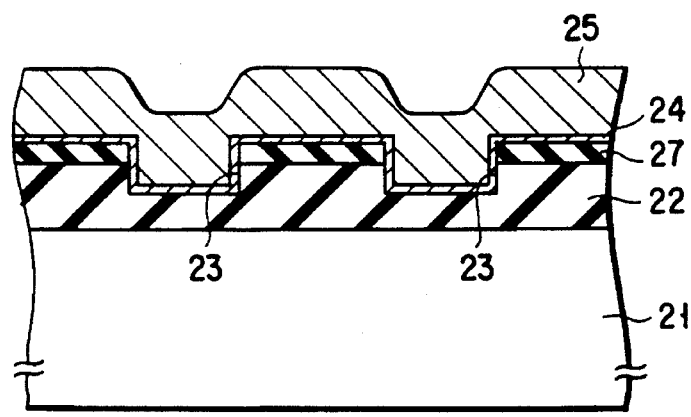

First, as in FIG. 13A, an 800 nm thick $SiO_2$ film 22 and a 200 nm thick $Si_3N_4$ film 27 were deposited in this order to form an insulating interlayer by a CVD process on a silicon substrate 21 on the surface of which diffusion layers such as a source and a drain (not shown) were formed. Thereafter, a plurality of trenches 23, 500 nm in depth, having a shape corresponding to an interconnecting layer were formed in the $Si_3N_4$ film 27 and the $SiO_2$ film 22 by photoetching. As shown in FIG. 13B, a 15 nm thick TiN barrier layer 24 and a 600-nm thick Cu film 25 were deposited in this order by sputter vapor deposition on the $Si_3N_4$ film 27 including the trenches 23.

Subsequently, the substrate 21, FIG. 13B, was held upside down by the substrate holder 5 of the polishing apparatus discussed earlier with reference to FIG. 1. A load of 300 g/cm$^2$ was applied from the support shaft 4 of the holder 5 to the substrate toward the polishing pad 2 which was covered on the turntable 1 and consisted of SUBA800 (tradename) manufactured by Rodel Nitta Corp. While the turntable 1 and the holder 5 were rotated in the opposite directions at a rotating speed of 100 ppm, a polishing solution was supplied from the supply pipe 3 to the polishing pad 2 at a rate of 20 ml/min, thereby polishing the Cu film 25 and the barrier layer 24 deposited on the substrate 21 until the surface of the $Si_3N_4$ film 27 was exposed. Note that the polishing solution used was pure water containing 0.1 wt % of aminoacetic acid, 13.0 wt % of hydrogen peroxide, and 8 wt % of a silica powder with a mean grain size of 0.04 μm, in which the weight ratio of aminoacetic acid to hydrogen peroxide was 1 to 130. In the polishing step described above, the etching rate of the polishing solution when the solution was in contact with the Cu film was zero, and the etching rate during the polishing performed by the polishing pad was about 77 nm/min, which was sufficiently higher than that during the dipping. Consequently, in the polishing step the Cu film 25 with projections as in FIG. 13B was preferentially polished from the surface in mechanically contact with the polishing pad, and the exposed barrier layer 24 was then polished; i.e., so-called etch back was performed.

Figure 13C:
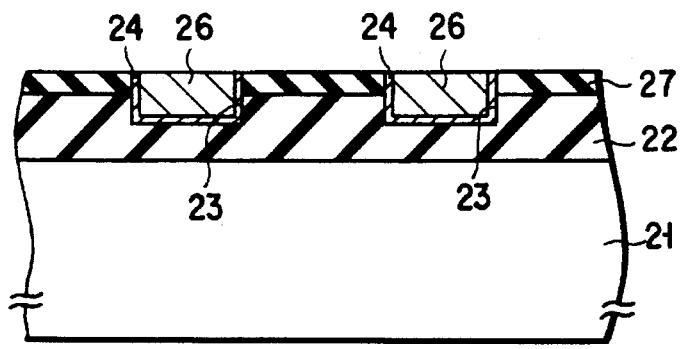

As a result, as illustrated in FIG. 13C, the barrier layer 24 was left behind only in the trenches 23, and a buried Cu interconnecting layer 26 whose surface was level with the surface of the $Si_3N_4$ film 27 was formed in the trenches 23 covered with the barrier layer 24. After the load applied from the holder 5 of the polishing apparatus to the polishing pad 2 was removed and the rotations of the turntable 1 and the holder 5 were stopped, no etching proceeded even when the Cu interconnecting layer 26 came into contact with the polishing solution.

Furthermore, since the $Si_3N_4$ film 27 exhibiting a high polishing resistance in the polishing step using the polishing solution containing the silica grains as abrasive grains was formed on the surface of the insulating interlayer, it was possible to suppress a decrease in the film thickness in the etch-back step. This made it possible to manufacture a semiconductor device including an insulating interlayer with a high withstand voltage.

EXAMPLE 3

First, as in FIG. 14A, a 1000 nm thick $Si_3N_4$ film 27 as an insulating interlayer was deposited by a CVD process on a silicon substrate 21 on the surface of which diffusion layers such as a source and a drain (not shown) were formed. Thereafter, a plurality of trenches 23, 500 nm in depth, having a shape corresponding to an interconnecting layer were formed in the $Si_3N_4$ film 27 by photoetching. As shown in FIG. 14B, a 600 nm thick Cu film 25 was deposited on the $Si_3N_4$ film 27 including the trenches 23 by sputter vapor deposition.

Subsequently, the substrate 21, FIG. 14B, was held upside down by the substrate holder 5 of the polishing apparatus discussed earlier with reference to FIG. 1. A load of 400 g/cm$^2$ was applied from the support shaft 4 of the holder 5 to the substrate toward the polishing pad 2 which was covered on the turntable 1 and consisted of SUBA800 (tradename) manufactured by Rodel Nitta Corp. While the turntable 1 and the holder 5 were rotated in the opposite directions at a rotating speed of 100 ppm, a polishing solution was supplied from the supply pipe 3 to the polishing pad 2 at a rate of 20 ml/min, thereby polishing the Cu film 25 deposited on the substrate 21 until the surface of the $Si_3N_4$ film 27 was exposed. Note that the polishing solution used was pure water containing 0.9 wt % of aminoacetic acid, 22.0 wt % of hydrogen peroxide, and 3.7 wt % of potassium hydroxide, in which the weight ratio of aminoacetic acid to hydrogen peroxide was 1 to about 24 and the pH was 10.5. In the polishing step described above, the etching rate of the polishing solution when the solution was in contact with the Cu film was zero, and the etching rate during the polishing performed by the polishing pad was about 220 nm/min, which was sufficiently higher than that during the dipping. Consequently, in the polishing step the Cu film 25 with projections as in FIG. 14B was preferentially polished from the surface in mechanically contact with the polishing pad, i.e., subjected to so-called etch back.

As a result, as illustrated in FIG. 14C, a buried Cu interconnecting layer 26 whose surface was level with the surface of the $Si_3N_4$ film 27 was formed in the trenches 23. After the load applied from the holder 5 of the polishing apparatus to the polishing pad 2 was removed and the rotations of the turntable 1 and the holder 5 were stopped, no etching proceeded even when the Cu interconnecting layer 26 came into contact with the polishing solution.

Furthermore, the insulating interlayer having the trenches 23 in which the buried Cu interconnecting layer 26 was formed was constructed from $Si_3N_4$ with a good Cu diffusion barrier property. Therefore, since Cu did not diffuse across the insulating interlayer 27 to reach the silicon substrate 21 from the Cu interconnecting layer 26, it was possible to avoid contamination of the substrate 21 without forming any barrier layer such as a TiN layer on the inner surfaces of the trenches 23.

EXAMPLE 4

First, as in FIG. 15A, a 1000 nm thick $SiO_2$ film 33 as a first insulating interlayer was deposited by a CVD process on a p-type silicon substrate 32 on the surface of which an $n^+$-type diffusion layer 31 was formed. Thereafter, a via hole 34 was formed in a portion of the $SiO_2$ film 33 corresponding to the diffusion layer 31 by photoetching. As shown in FIG. 15B, a 20 nm thick TiN barrier layer 35 was deposited on the $SiO_2$ film 33 including the via hole 34 by sputter vapor deposition, and a 1100 nm thick Cu film 36 was then deposited by sputter vapor deposition.

Subsequently, the substrate 32, FIG. 15B, was held upside down by the substrate holder 5 of the polishing apparatus discussed earlier with reference to FIG. 1. A load of 300 g/cm$^2$ was applied from the support shaft 4 of the holder 5 to the substrate toward the polishing pad 2 which was covered on the turntable 1 and consisted of SUBA800 (tradename) manufactured by Rodel Nitta Corp. While the turntable 1 and the holder 5 were rotated in the opposite directions at a rotating speed of 100 ppm, a polishing solution was supplied from the supply pipe 3 to the polishing pad 2 at a rate of 20 ml/min, thereby polishing the Cu film 36 and the barrier layer 35 deposited on the substrate 32 until the surface of the $SiO_2$ film 33 was exposed. Note that the polishing solution used was pure water containing 0.2 wt % of aminoacetic acid, 20.0 wt % of hydrogen peroxide, and 10 wt % of a silica powder with a mean grain size of 0.04 μm, in which the weight ratio of aminoacetic acid to hydrogen peroxide was 1 to 100. In the polishing step described above, the etching rate of the polishing solution when the solution was in contact with the Cu film was zero, and the etching rate during the polishing performed by the polishing pad was about 70 nm/min, which was sufficiently higher than that during the dipping. Consequently, in the polishing step the Cu film 36 with projections as in FIG. 15B was preferentially polished from the surface in mechanically contact with the polishing pad, and the exposed barrier layer 35 was then polished; i.e., so-called etch back was performed. As a result, as illustrated in FIG. 15C, the barrier layer 35 was left behind only in the via hole 34, and a Cu via fill 37 whose surface was level with the surface of the $SiO_2$ film 33 was formed in the via hole 34 covered with the barrier layer 35. After the load applied from the holder 5 of the polishing apparatus to the polishing pad 2 was removed and the rotations of the turntable 1 and the holder 5 were stopped, no etching proceeded even when the Cu via fill 37 was brought into contact with the polishing solution. Subsequently, the substrate in which the via fill 37 was formed was treated by dipping into an aqueous dissolved ozone solution with an ozone concentration of 0.002% for 3 minutes, and then treated by dipping into an aqueous dilute hydrofluoric acid solution with a hydrofluoric acid concentration of 5% for 9 seconds, thereby cleaning the surface of the SiO$_2$ film 33.

Figure 15D:
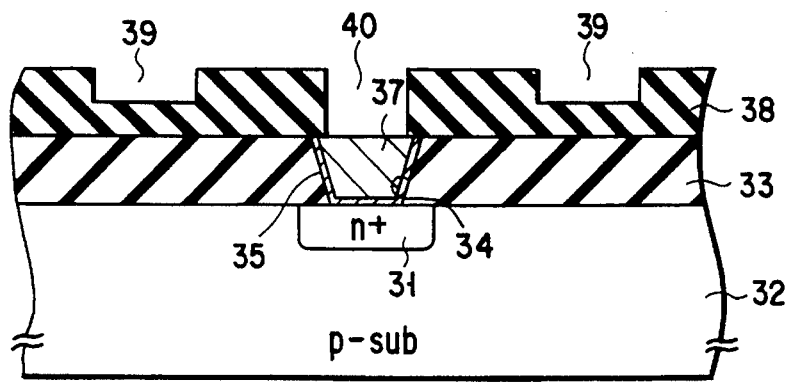
Figure 15E:
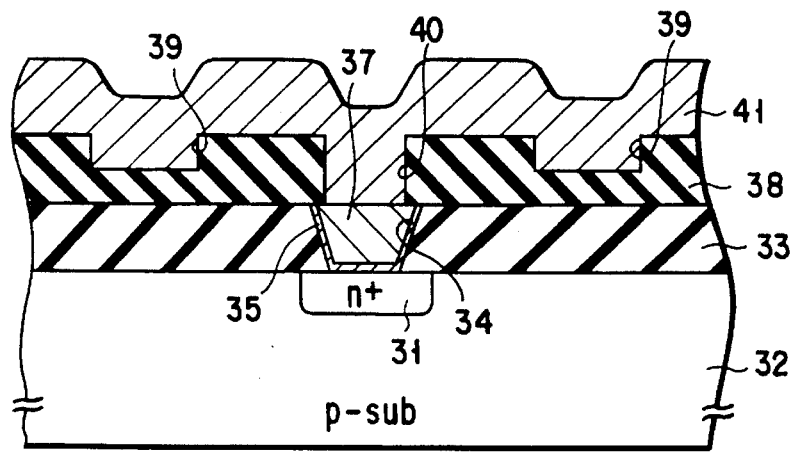

Subsequently, as in FIG. 15D, an 800 nm thick Si$_3$N$_4$ film 38 as a second insulating interlayer was deposited by a CVD process on the SiO$_2$ film 33 including the via fill 37. Thereafter, a plurality of trenches 39,400 nm in depth, having a shape corresponding to an interconnecting layer were formed in the Si$_3$N$_4$ film 38 by photoetching. In addition, a through hole 40 was formed in the trench 39 located on the via fill 37 by photoetching. As shown in FIG. 15E, a 900 nm thick Cu film 41 was deposited on the Si$_3$N$_4$ film 38 including the trenches 39 and the through hole 40 by sputter vapor deposition.

Figure 15F:
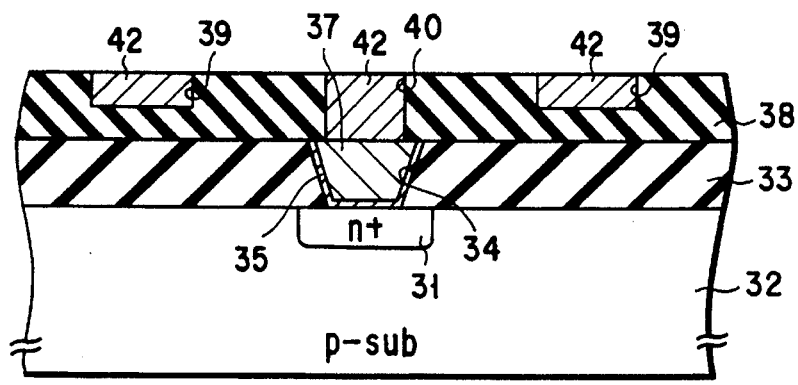

Subsequently, the substrate 32, FIG. 15E, was held upside down by the substrate holder 5 of the polishing apparatus discussed earlier with reference to FIG. 1. A load of 300 g/cm$^2$ was applied from the support shaft 4 of the holder 5 to the substrate toward the polishing pad 2 which was covered on the turntable 1 and consisted of SUBA800 (tradename) manufactured by Rodel Nitta Corp. While the turntable 1 and the holder 5 were rotated in the opposite directions at a rotating speed of 100 ppm, a polishing solution of the composition identical with that used in the etch-back step described above was supplied from the supply pipe 3 to the polishing pad 2 at a rate of 20 ml/min, thereby polishing the Cu film 41 deposited on the substrate 32 until the surface of the Si$_3$N$_4$ film 38 was exposed. Consequently, the Cu film 41 with projections as in FIG. 15E was preferentially polished from the surface in mechanically contact with the polishing pad, i.e., subjected to so-called etch back. By this etch back, a buried Cu interconnecting layer 42 whose surface was level with the surface of the Si$_3$N$_4$ film 38 was formed in the trenches 39, as illustrated in FIG. 15F. Simultaneously, a buried Cu interconnecting layer 42 connected to the via fill 37 through the through hole 40 was also formed. After the load applied from the holder 5 of the polishing apparatus to the polishing pad 2 was removed and the rotations of the turntable 1 and the holder 5 were stopped, no etching proceeded even when the Cu interconnecting layer 42 came into contact with the polishing solution.

In Example 4 of the present invention, therefore, it was possible to manufacture a semiconductor device which had a multilayer interconnecting structure including the first and second insulating interlayers 33 and 38, the via fill 37 formed in the first insulating interlayer 33 and having a surface level with the surface of the first insulating interlayer 33, and the Cu interconnecting layer 42 formed in the second insulating interlayer 38 and having a surface level with the second insulating interlayer 38, and which also had a flat surface.

According to the present invention as has been discussed above, it is possible to provide a copper-based metal polishing solution which hardly etches Cu or Cu alloy when Cu or a Cu alloy is dipped into the solution, and has an etching rate during polishing several times to several ten times higher than that during dipping.

According to the present invention, it is also possible to provide a method for manufacturing a semiconductor device with a flat surface, in which a trench and/or an opening is formed in an insulating film on a semiconductor substrate, an interconnection material film deposited on the insulating film and consisting of Cu or a Cu alloy can be etched back within a short time period, and consequently a buried interconnecting layer consisting of Cu or a Cu alloy is formed in the insulating film such that the surface of the interconnecting layer is level with the surface of the insulating film.

Furthermore, according to the present invention, it is possible to provide a method for manufacturing a semiconductor device, in which a trench and/or an opening is formed in an insulating film on a semiconductor substrate, and an interconnection material film deposited on the insulating film and consisting of Cu or a Cu alloy can be etched back within a short time period to form a buried interconnecting layer whose surface is level with the surface of the insulating film, and which has a clean, flat surface obtained by removing an organic substance or the residual interconnection material from the surface of the insulating film after the etch back.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A copper-based metal polishing solution containing at least one organic acid selected from the group consisting of aminoacetic acid and amidosulfuric acid, an oxidizer, and water.

2. The polishing solution according to claim 1, wherein said oxidizer is hydrogen peroxide.

3. The polishing solution according to claim 1, wherein said organic acid is contained in an amount of 0.01 to 10 wt % in said polishing solution, and a content ratio of said organic acid to said oxidizer is 1 to not less than 20 as a weight ratio.

4. The polishing solution according to claim 3, wherein said organic acid is contained in an amount of 0.01 to 1 wt % in said polishing solution.

5. The polishing solution according to claim 3, wherein the content ratio of said organic acid to said oxidizer is 1 to not less than 40 as a weight ratio.

6. The polishing solution according to claim 3, wherein said oxidizer is contained in an amount of a maximum of 30 wt % in said polishing solution.

7. The polishing solution according to claim 1, further containing an alkaline agent for adjusting a pH of the solution between 9 and 14.

8. The polishing solution according to claim 7, wherein said alkaline agent is potassium hydroxide.

9. The polishing solution according to claim 7, wherein said alkaline agent is quinoline.

10. The polishing solution according to claim 1, further containing abrasive grains.

11. The polishing solution according to claim 10, wherein said abrasive grain is made of at least one material selected from the group consisting of silica, zirconia, cerium oxide, and alumina.

12. The polishing solution according to claim 10, wherein said abrasive grains have a mean grain size of 0.02 to 0.1 µm.

13. The polishing solution according to claim 10, wherein said abrasive grains are contained in an amount of 1 to 14 wt % in said polishing solution.

14. The polishing solution according to claim 10, wherein said abrasive grains are contained in an amount of 3 to 10 wt % in said polishing solution.

15. A method for manufacturing a semiconductor device, comprising the steps of:

forming at least one member selected from the group consisting of a trench and an opening corresponding to a shape of an interconnecting layer in an insulating film on a semiconductor substrate;

depositing an interconnection material film consisting of copper or a copper alloy on said insulating film including said at least one member selected from the group consisting of a trench and an opening; and polishing said interconnection material film until a surface of said insulating film is exposed by using a polishing solution containing at least one organic acid selected from the group consisting of aminoacetic acid and amidosulfuric acid, an oxidizer, and water, thereby forming a buried interconnecting layer in said insulating film such that surfaces of said interconnecting layer and said insulting film are level with each other.

16. The method according to claim 15, wherein said insulating film is a silicon oxide film.

17. The method according to claim 15, wherein said insulating film has a two-layer structure constituted by a silicon oxide film and a silicon nitride film formed on said silicon oxide film.

18. The method according to claim 15, wherein a barrier layer is formed on said insulating film including said at least one member selected from the group consisting of a trench and an opening prior to depositing said interconnection material film.

19. The method according to claim 18, wherein said barrier layer is made of one material selected from the group consisting of TiN, Ti, Nb, W, and a CuTa alloy.

20. The method according to claim 19, wherein said barrier layer has a thickness of 15 to 50 nm.

21. The method according to claim 15, wherein said Cu alloy is one material selected from the group consisting of a Cu—Si alloy, a Cu—Al alloy, a Cu—Si—Al alloy, and a Cu—Ag alloy.

22. The method according to claim 15, wherein said oxidizer is hydrogen peroxide.

23. The method according to claim 15, wherein said organic acid is contained in an amount of 0.01 to 10 wt % in said polishing solution, and a content ratio of said organic acid to said oxidizer is 1 to not less than 20 as a weight ratio.

24. The method according to claim 23, wherein said organic acid is contained in an amount of 0.01 to 1 wt % in said polishing solution.

25. The method according to claim 23, wherein the content ratio of said organic acid to said oxidizer is 1 to not less than 40 as a weight ratio.

26. The method according to claim 23, wherein said oxidizer is contained in an amount of a maximum of 30 wt % in said polishing solution.

27. The method according to claim 15, wherein said polishing solution further contains an alkaline agent for adjusting a pH of the solution between 9 and 14.

28. The method according to claim 27, wherein said alkaline agent is potassium hydroxide.

29. The method according to claim 27, wherein said alkaline agent is quinoline.

30. The method according to claim 15, wherein said polishing solution further contains abrasive grains.

31. The method according to claim 30, wherein said abrasive grain is made of at least one material selected from the group consisting of silica, zirconia, cerium oxide, and alumina.

32. The method according to claim 30, wherein said abrasive grains have a mean grain size of 0.02 to 0.1 μm.

33. The method according to claim 30, wherein said abrasive grains are contained in an amount of 1 to 14 wt % in said polishing solution.

34. The method according to claim 30, wherein said abrasive grains are contained in an amount of 3 to 10 wt % in said polishing solution.

35. The method to claim 15, wherein the polishing is performed by using apparatus comprising a turntable covered with a polishing pad, means for supplying said polishing solution to said polishing pad of said turntable, and a substrate holder which holds said semiconductor substrate on a lower surface thereof and rotates said substrate while pressing said substrate against said polishing pad.

36. The method according to claim 35, wherein an end point of the polishing is detected n the basis of a change in torque of said turntable of said polishing apparatus.

37. The method to claim 35, wherein an end point of the polishing is detected on the basis of a change in temperature of said polishing pad.

38. The method according to claim 35, wherein an end point of the polishing is detected on the basis of a change in pH of said polishing solution supplied to said polishing pad.

39. A method for manufacturing a semiconductor device, comprising the steps of:

forming at least one member selected from the group consisting of a trench and an opening corresponding to a shape of an interconnecting layer in an insulating film on a semiconductor substrate;

depositing an interconnection material film consisting of copper or a copper alloy on said insulating film including said at least one member selected from the group consisting of a trench and an opening;

polishing said interconnection material film until a surface of said insulating film is exposed by using a polishing solution containing at least one organic acid selected from the group consisting of aminoacetic acid and amidosulfuric acid, an oxidizer, and water, thereby forming a buried interconnecting layer in said insulating film such that surfaces of said interconnecting layer and said insulting film are level with each other; and treating the surface of said insulating film including said interconnecting layer with an aqueous dissolved ozone solution and then with an aqueous dilute hydrofluoric acid solution.

40. The method according to claim 39, wherein said insulating film is a silicon oxide film.

41. The method according to claim 39, wherein said insulating film has a two-layer structure constituted by a silicon oxide film and a silicon nitride film formed on said silicon oxide film.

42. The method according to claim 39, wherein a barrier layer is formed on said insulating film including said at least one member selected from the group consisting of a trench and an opening prior to depositing said interconnection material film.

43. The method according to claim 42, wherein said barrier layer is made of one material selected from the group consisting of TiN, Ti, Nb, W, and a CuTa alloy.

44. The method according to claim 42, wherein said barrier layer has a thickness of 15 to 50 nm.

45. The method according to claim 39, wherein said Cu alloy is one material selected from the group consisting of a Cu—Si alloy, a Cu—Al alloy, a Cu—Si—Al alloy, and a Cu—Ag alloy.

46. The method according to claim 39, wherein said oxidizer is hydrogen peroxide.

47. The method according to claim 39, wherein said organic acid is contained in an amount of 0.01 to 10 wt % in said polishing solution, and a content ratio of said organic acid to said oxidizer is 1 to not less than 20 as a weight ratio.

48. The method according to claim 47, wherein said organic acid is contained in an amount of 0.01 to 1 wt % in said polishing solution.

49. The method according to claim 47, wherein the content ratio of said organic acid to said oxidizer is 1 to not less than 40 as a weight ratio.

50. The method according to claim 47, wherein said oxidizer is contained in an amount of a maximum of 30 wt % in said polishing solution.

51. The method according to claim 39, wherein said polishing solution further contains an alkaline agent for adjusting a pH of the solution between 9 and 14.

52. The method according to claim 51, wherein said alkaline agent is potassium hydroxide.

53. The method according to claim 51, wherein said alkaline agent is quinoline.

54. The method according to claim 39, wherein said polishing solution further contains abrasive grains.

55. The method according to claim 54, wherein said abrasive grain is made of at least one material selected from the group consisting of silica, zirconia, cerium oxide, and alumina.

56. The method according to claim 54, wherein said abrasive grains have a mean grain size of 0.02 to 0.1 µm.

57. The method according to claim 54, wherein said abrasive grains are contained in an amount of 1 to 14 wt % in said polishing solution.

58. The method according to claim 54, wherein said abrasive grains are contained in an amount of 3 to 10 wt % in said polishing solution.

59. The method according to claim 39, wherein the polishing is performed by using a polishing apparatus comprising a turntable covered with a polishing pad, means for supplying said polishing solution to said polishing pad of said turntable, and a substrate holder which holds said semiconductor substrate on a lower surface thereof and rotates said substrate while pressing said substrate against said polishing pad.

60. The method according to claim 59, wherein an end point of the polishing is detected on the basis of a change in torque of said turntable of said polishing apparatus.

61. The method according to claim 59, wherein an end point of the polishing is detected on the basis of a change in temperature of said polishing pad.

62. The method according to claim 59, wherein an end point of the polishing is detected on the basis of a change in pH of said polishing solution supplied to said polishing pad.

63. The method according to claim 39, wherein said aqueous dissolved ozone solution has an ozone concentration of 0.1 to 25 ppm.

64. The method according to claim 39, wherein said aqueous dissolved ozone solution has an ozone concentration of 5 to 25 ppm.

65. The method according to claim 39, wherein said aqueous dilute hydrofluoric acid solution has a hydrofluoric acid concentration of 0.05 to 20%.

66. The method according to claim 39, wherein said aqueous dilute hydrofluoric acid solution has a hydrofluoric acid concentration of 0.1 to 5%.

\* \* \* \* \*